US010332755B2

(12) United States Patent
Yoon et al.

(10) Patent No.: US 10,332,755 B2
(45) Date of Patent: Jun. 25, 2019

(54) PACKAGE SUBSTRATES AND METHODS OF FABRICATING THE SAME

(71) Applicants: Hyesun Yoon, Anyang-si (KR); Geunwoo Kim, Asan-si (KR); Youngjun Park, Asan-si (KR)

(72) Inventors: Hyesun Yoon, Anyang-si (KR); Geunwoo Kim, Asan-si (KR); Youngjun Park, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 15/093,492

(22) Filed: Apr. 7, 2016

(65) Prior Publication Data

US 2016/0300790 A1 Oct. 13, 2016

(30) Foreign Application Priority Data

Apr. 7, 2015 (KR) .................. 10-2015-0049047

(51) Int. Cl.
H01L 21/48 (2006.01)
H05K 3/00 (2006.01)
H05K 3/46 (2006.01)
H01L 23/498 (2006.01)
H01L 23/00 (2006.01)

(52) U.S. Cl.
CPC ......... *H01L 21/481* (2013.01); *H05K 3/0052* (2013.01); *H01L 21/486* (2013.01); *H01L 23/49822* (2013.01); *H01L 23/49827* (2013.01); *H01L 23/562* (2013.01); *H05K 3/4602* (2013.01); *H05K 2201/0909* (2013.01); *H05K 2201/09036* (2013.01)

(58) Field of Classification Search
None
See application file for complete search history.

(56) References Cited

U.S. PATENT DOCUMENTS

| 4,746,830 | A | * | 5/1988 | Holland | G01S 13/755 310/313 D |
| 5,394,609 | A | * | 3/1995 | Ferguson | H01R 43/205 228/180.21 |
| 5,981,314 | A | * | 11/1999 | Glenn | H01L 21/56 257/E21.502 |
| 6,162,703 | A | * | 12/2000 | Muntifering | H01L 21/304 257/E21.237 |

(Continued)

FOREIGN PATENT DOCUMENTS

JP 2014216478 A 11/2014
KR 20020054476 * 7/2002 ............. H01L 23/28

(Continued)

*Primary Examiner* — Dimary S Lopez Cruz
*Assistant Examiner* — Muhammed Azam
(74) *Attorney, Agent, or Firm* — Renaissance IP Law Group LLP

(57) ABSTRACT

A package substrate includes a core portion comprising a first surface and a second surface arranged opposite to each other; first cutting regions provided to penetrate at least a portion of the core portion in a thickness direction; a first upper circuit pattern disposed on the first surface of the core portion; and an insulating layer provided to cover the first surface of the core portion and to fill the first cutting regions. The first cutting regions are spaced apart from each other in a first direction that is substantially parallel to one side of the core portion.

13 Claims, 21 Drawing Sheets

(56) References Cited

U.S. PATENT DOCUMENTS

| | | | | |
|---|---|---|---|---|
| 6,214,645 | B1* | 4/2001 | Kim | H01L 21/565 |
| | | | | 257/E21.504 |
| 6,399,415 | B1* | 6/2002 | Bayan | H01L 23/3107 |
| | | | | 257/692 |
| 6,403,449 | B1* | 6/2002 | Ball | H01L 21/3043 |
| | | | | 257/E21.238 |
| 6,876,554 | B1* | 4/2005 | Inagaki | H01G 4/224 |
| | | | | 257/E23.062 |
| 7,105,378 | B2* | 9/2006 | Ng | H01L 21/4842 |
| | | | | 257/670 |
| 7,153,724 | B1* | 12/2006 | Sirinorakul | H01L 21/4828 |
| | | | | 438/112 |
| 7,479,409 | B2* | 1/2009 | Camacho | H01L 23/49541 |
| | | | | 257/666 |
| 7,800,216 | B2* | 9/2010 | Inagaki | H01L 21/4857 |
| | | | | 257/700 |
| 7,864,542 | B2* | 1/2011 | Inagaki | H01L 21/4857 |
| | | | | 174/260 |
| 8,118,820 | B2* | 2/2012 | Stokes | A61B 17/0469 |
| | | | | 606/139 |
| 8,119,920 | B2* | 2/2012 | Inagaki | H01L 21/4857 |
| | | | | 174/255 |
| 8,130,507 | B2* | 3/2012 | Origuchi | H01L 23/49838 |
| | | | | 174/260 |
| 8,466,372 | B2* | 6/2013 | Sakai | H01L 23/5389 |
| | | | | 174/260 |
| 8,525,314 | B2* | 9/2013 | Haba | H01L 23/49833 |
| | | | | 257/678 |
| 8,552,548 | B1* | 10/2013 | Do | H01L 23/481 |
| | | | | 257/698 |
| 8,745,863 | B2* | 6/2014 | Asai | H05K 3/387 |
| | | | | 29/830 |
| 8,848,380 | B2 | 9/2014 | Malatkar et al. | |
| 9,439,289 | B2* | 9/2016 | Furutani | H05K 1/0296 |
| 9,526,177 | B2* | 12/2016 | Lee | H05K 1/185 |
| 2003/0011070 | A1* | 1/2003 | Iijima | H01L 21/4857 |
| | | | | 257/734 |
| 2009/0038837 | A1 | 2/2009 | Okabe et al. | |
| 2011/0177292 | A1* | 7/2011 | Teshima | H01L 21/481 |
| | | | | 428/156 |
| 2012/0156955 | A1 | 6/2012 | Endo et al. | |
| 2012/0237751 | A1 | 9/2012 | Kotake et al. | |
| 2013/0003319 | A1 | 1/2013 | Malatkar et al. | |
| 2013/0182401 | A1* | 7/2013 | Furutani | H05K 1/0296 |
| | | | | 361/782 |
| 2014/0079924 | A1 | 3/2014 | Moon et al. | |
| 2014/0321084 | A1* | 10/2014 | Lee | H05K 1/185 |
| | | | | 361/761 |
| 2015/0021074 | A1 | 1/2015 | Kim et al. | |
| 2016/0120032 | A1* | 4/2016 | Park | H01L 24/97 |
| | | | | 361/748 |
| 2016/0300790 | A1* | 10/2016 | Yoon | H01L 21/481 |
| 2018/0294217 | A1* | 10/2018 | Nitta | H01L 23/12 |

FOREIGN PATENT DOCUMENTS

| | | |
|---|---|---|
| KR | 100821154 B1 | 4/2008 |
| KR | 20120005422 A | 1/2012 |
| KR | 20120032946 A | 4/2012 |
| KR | 20130015685 A | 2/2013 |
| KR | 20140026570 A | 3/2014 |
| KR | 101389899 A | 4/2014 |
| KR | 20140047438 A | 4/2014 |
| KR | 101472672 B1 | 12/2014 |
| KR | 20140146461 | 12/2014 |
| KR | 101487082 B1 | 1/2015 |
| KR | 101506794 | 3/2015 |

* cited by examiner

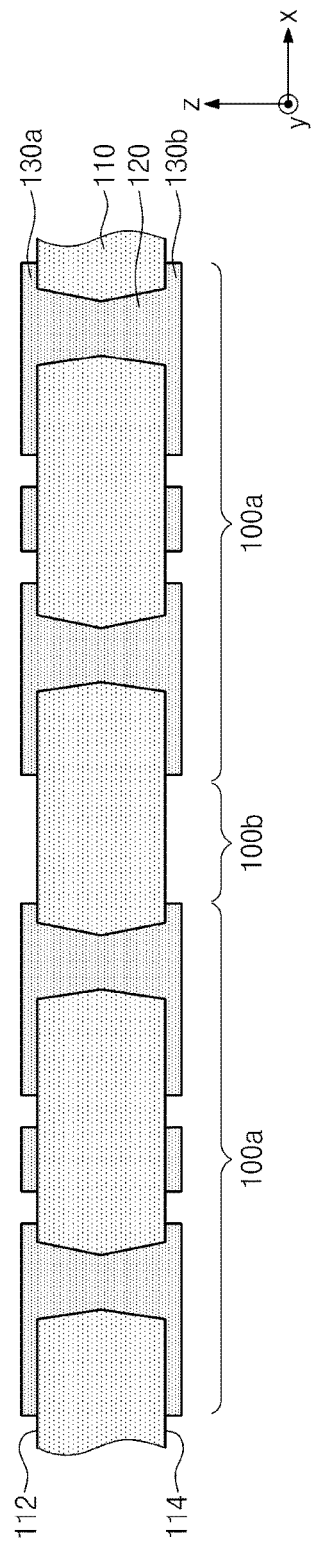
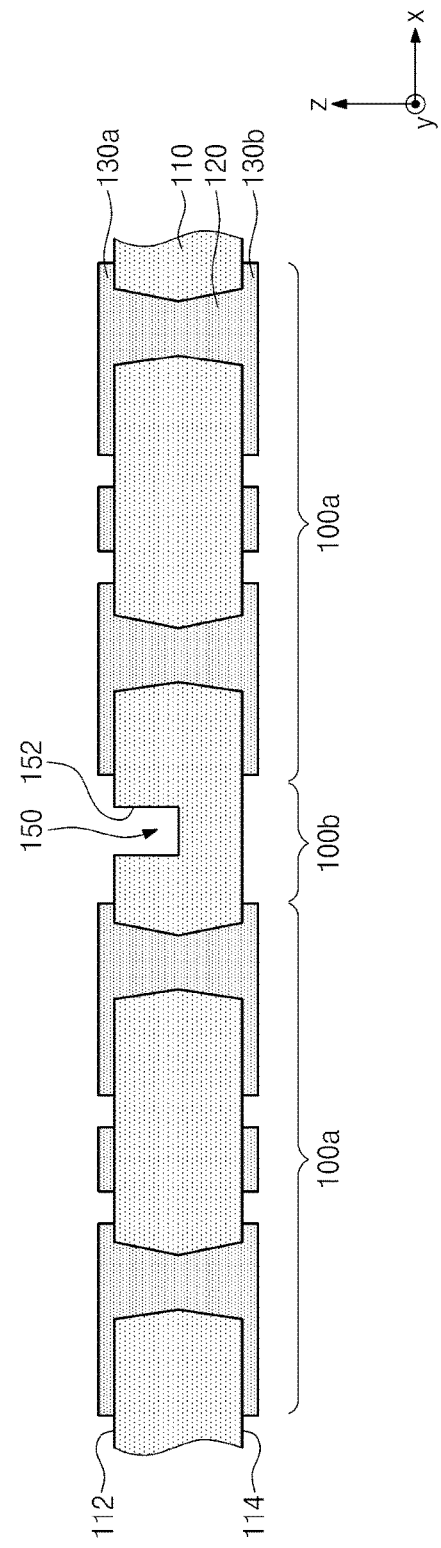

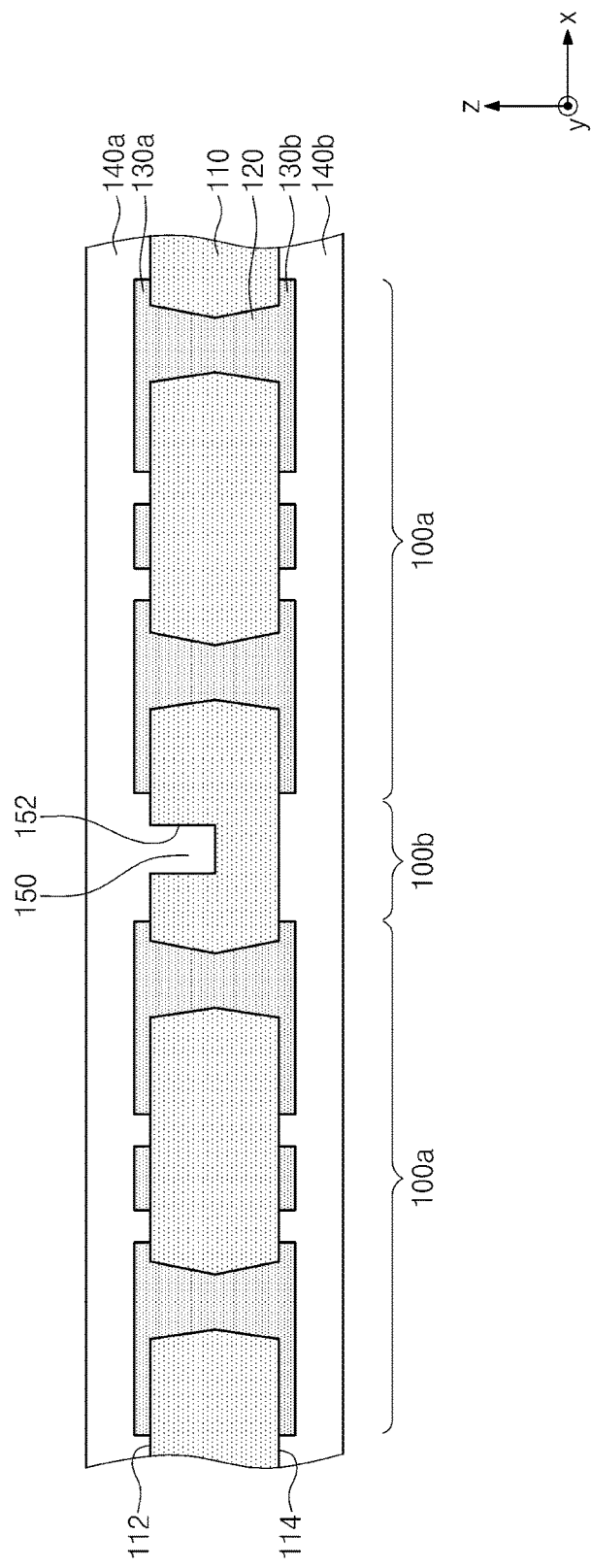

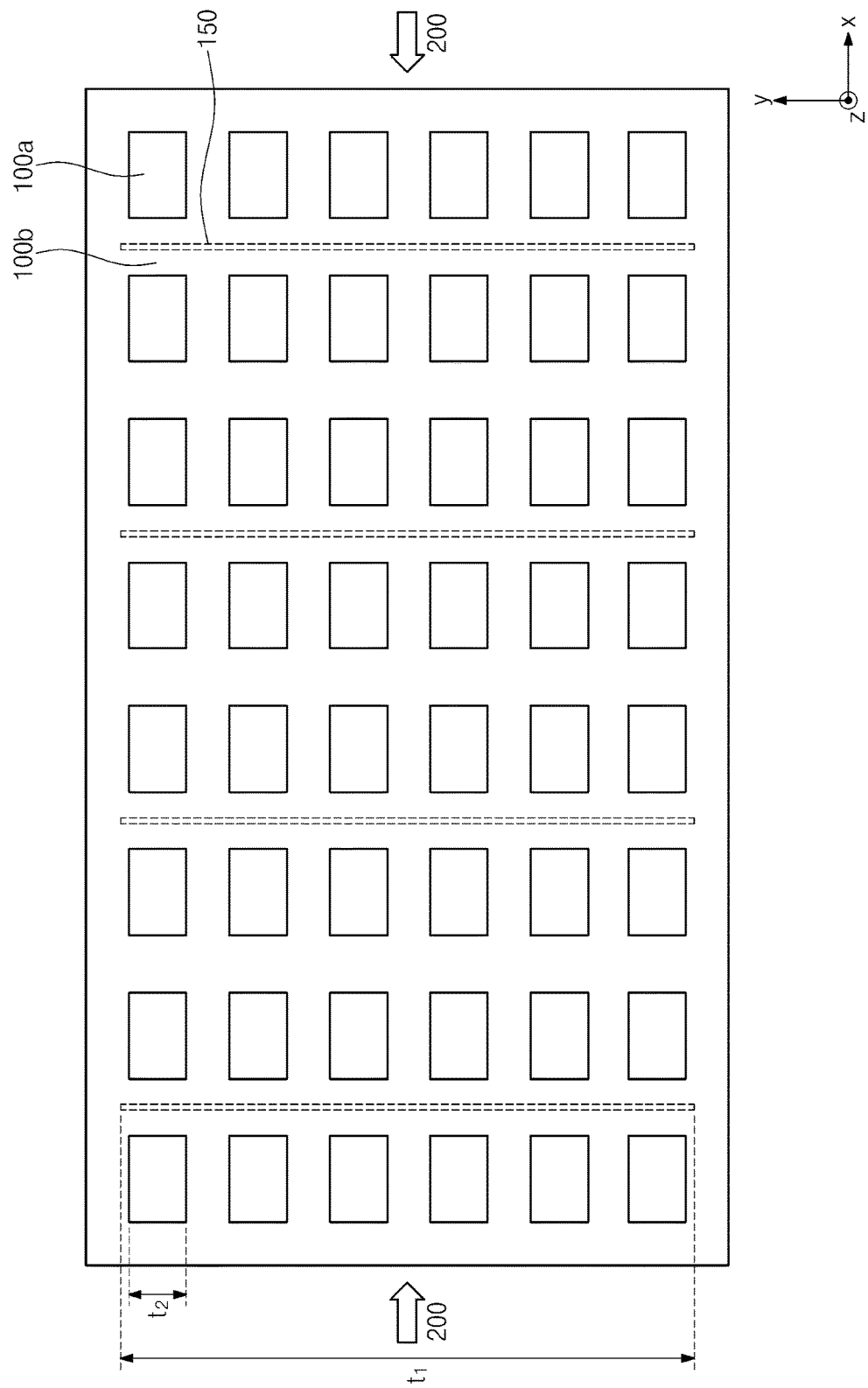

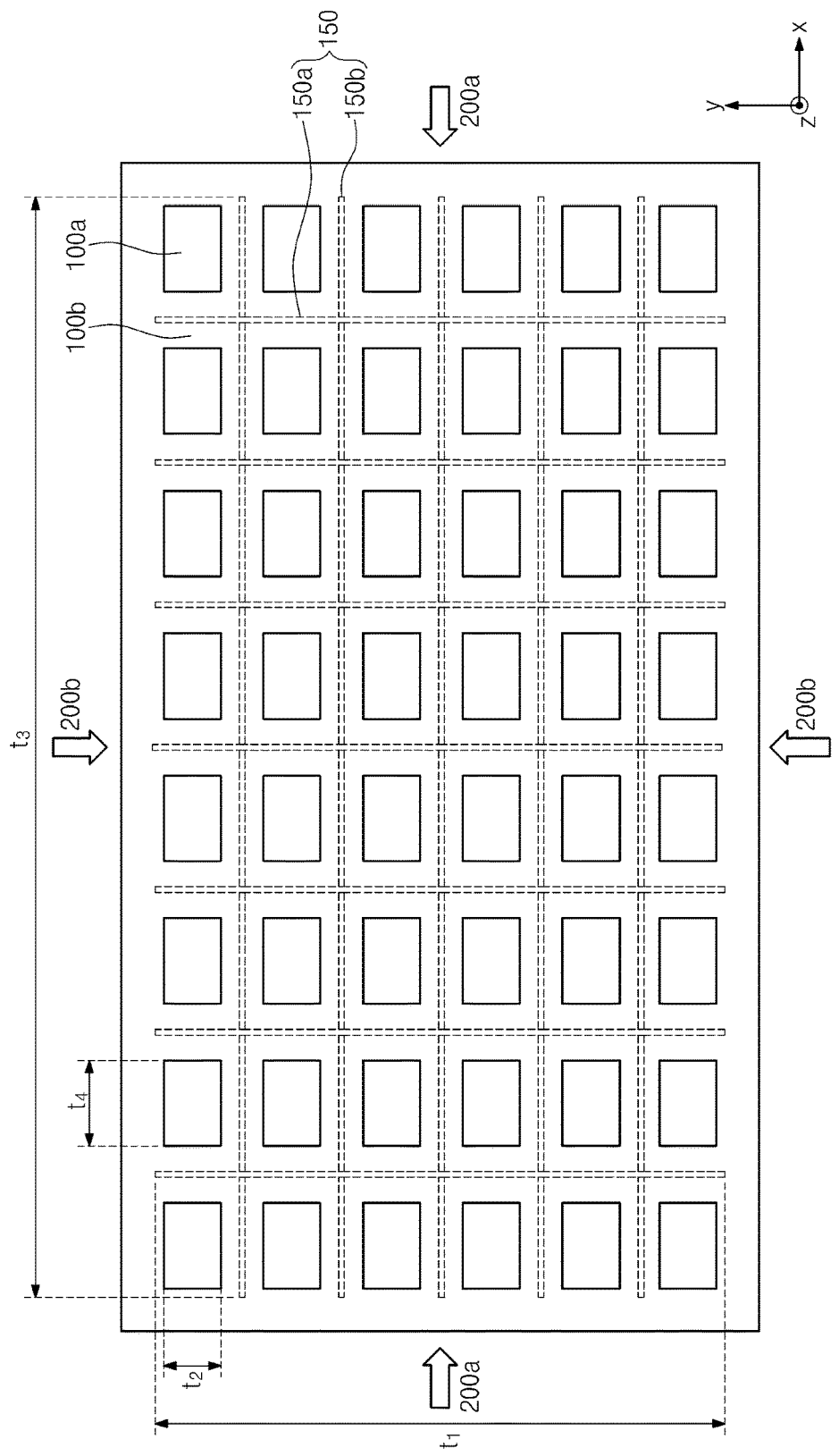

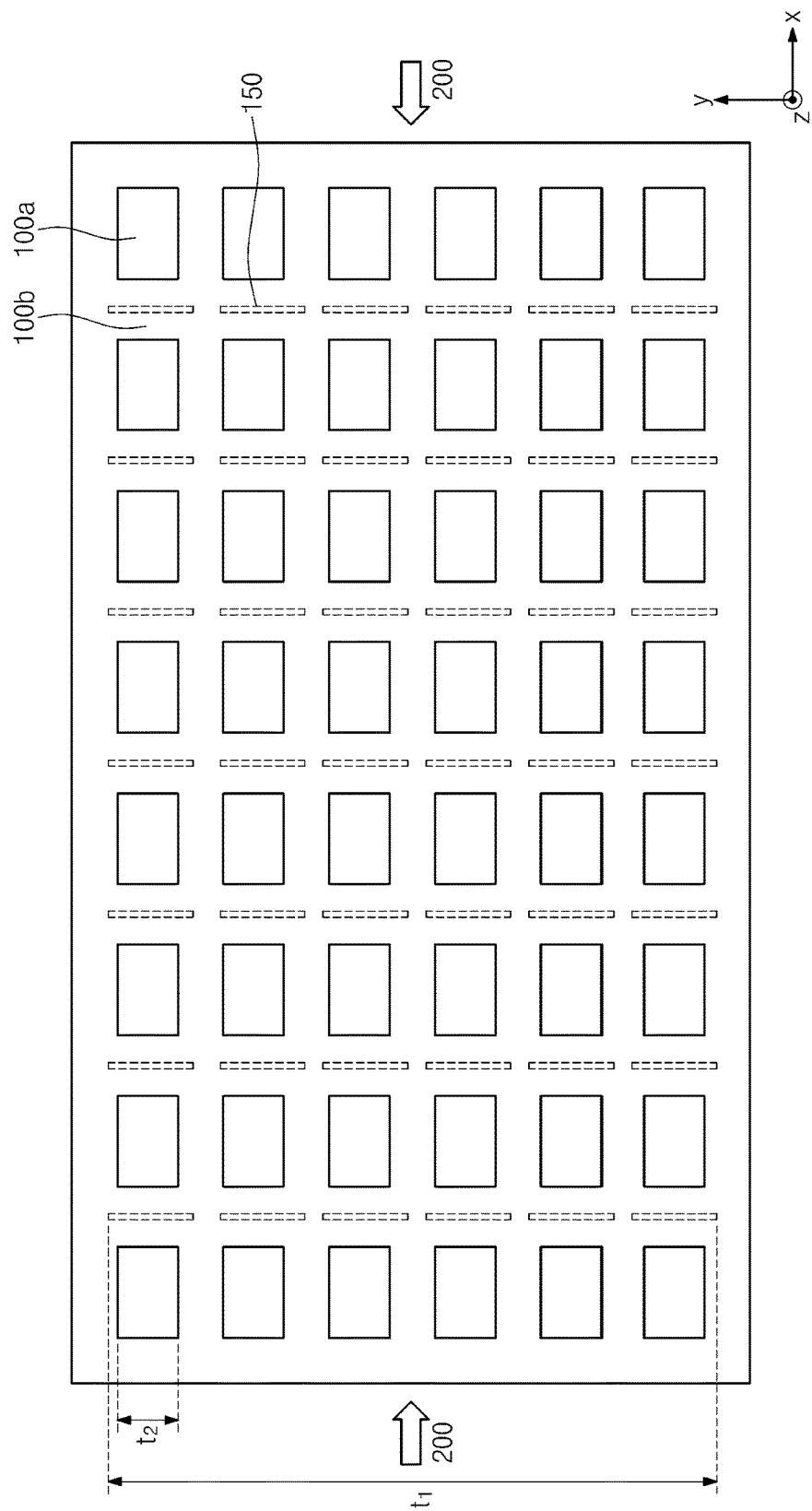

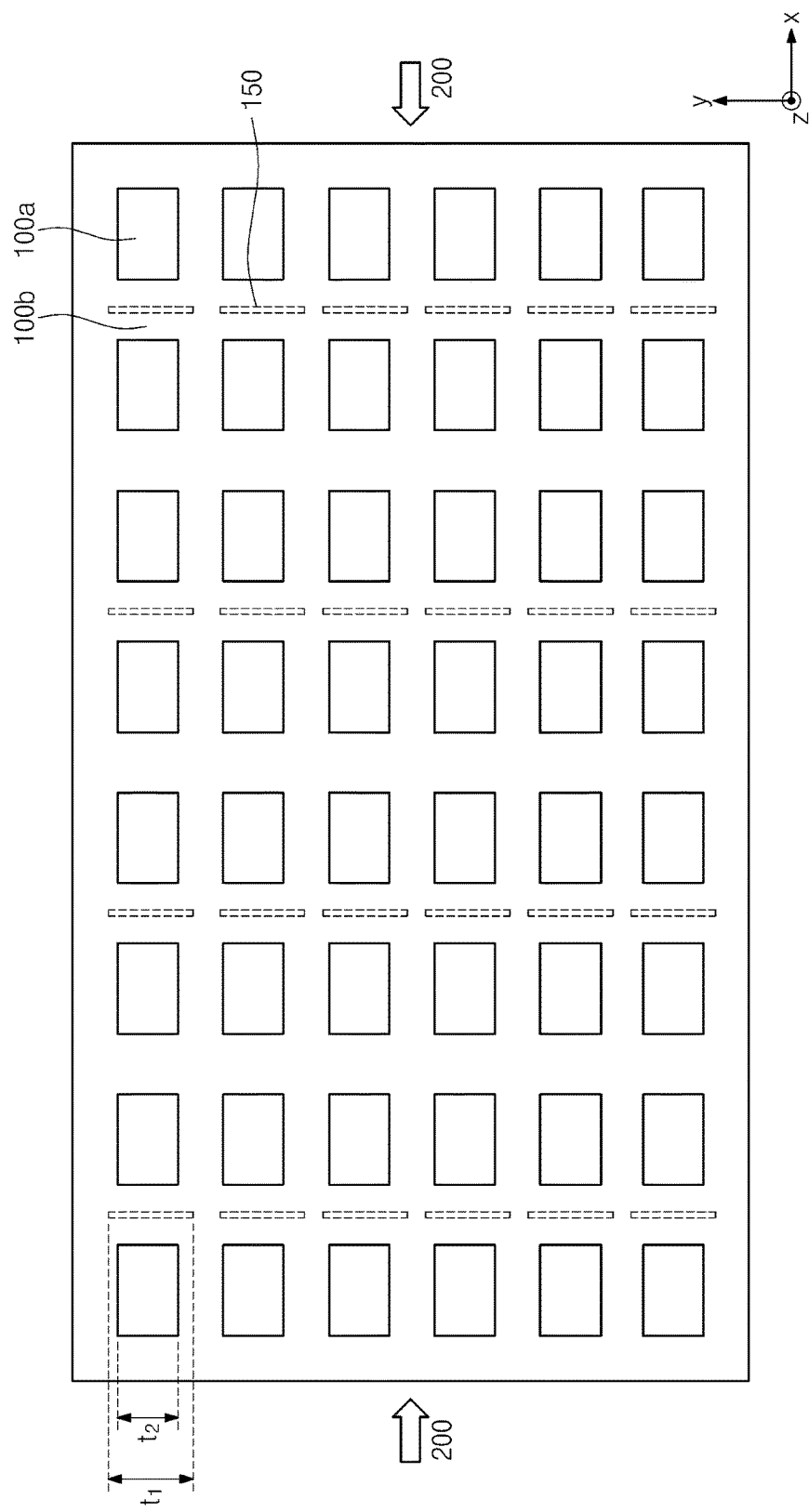

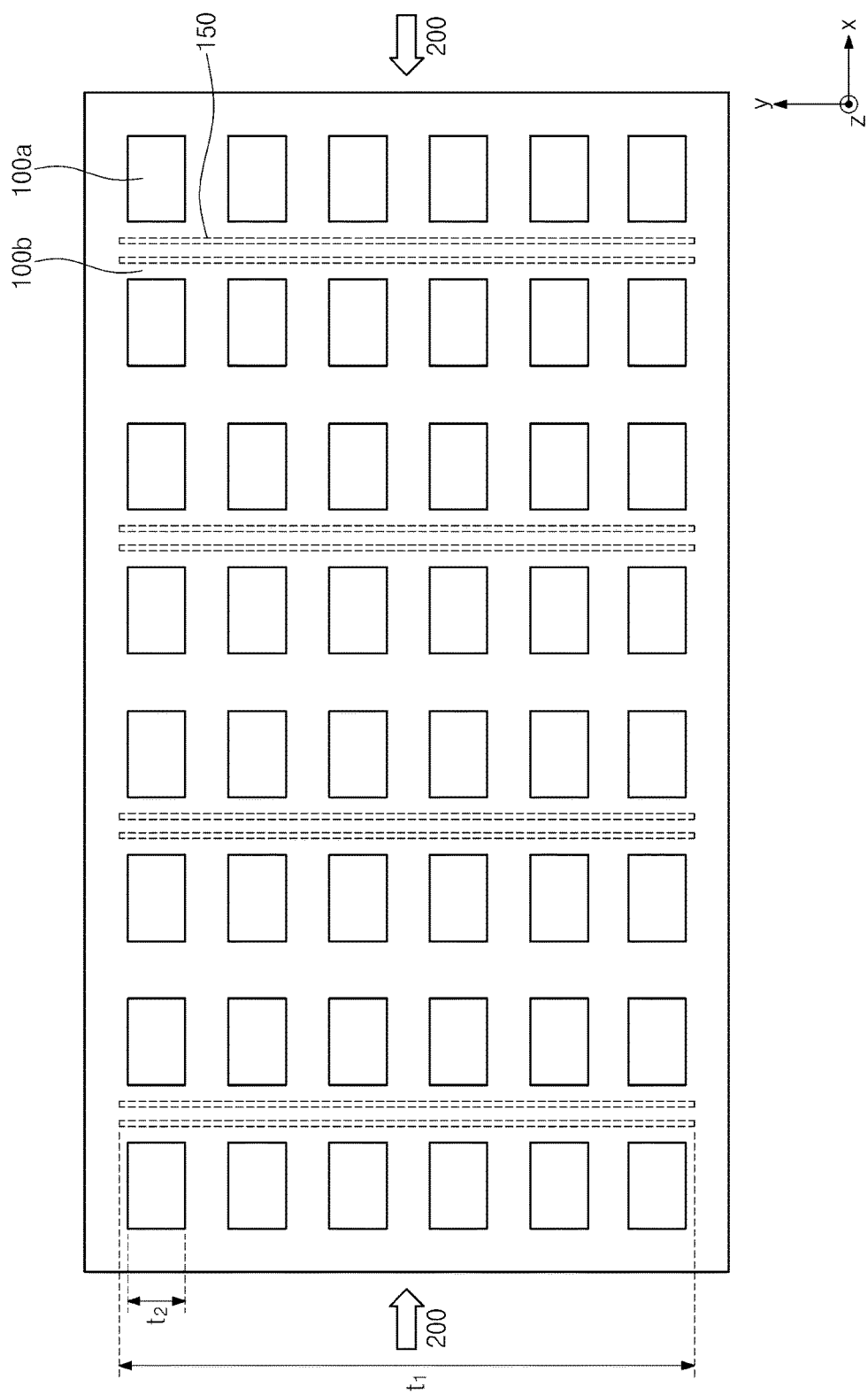

PACKAGE SUBSTRATES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2015-0049047, filed on Apr. 7, 2015, in the Korean Intellectual Property Office, the entire contents of which are hereby incorporated by reference.

BACKGROUND

The present disclosure relates to a package substrate, and in particular, to a package substrate with cutting regions and a method of fabricating the same.

In recent years, the electronic industry has been moving to smaller and thinner printed circuit boards (PCBs) with the rapid development of thinner, lighter, and smaller electronic products having a higher packing density. An increase in the integration density of an electronic product leads to an increase in a ratio of an area of a semiconductor chip, which is mounted on a package substrate, to an area of the package substrate. Furthermore, as the thickness of a package substrate decreases and a package product becomes more compact, a semiconductor package fabrication process may suffer from warpage of a package substrate, which may be caused by a difference in thermal expansion coefficients between a semiconductor chip, an epoxy molding compound, and a package substrate.

SUMMARY

An embodiment of the inventive concept provides package substrates, which are configured to substantially reduce the occurrence of shrinkage and warpage, and methods of fabricating the same.

According to example embodiments of the inventive concept, a method of fabricating a package substrate is provided. The method may include providing a core portion including first and second surfaces opposite to each other, cutting at least a portion of the core portion, in a thickness direction of the core portion from the first surface toward the second surface, to form a plurality of cutting regions, which are spaced apart from each other in a first direction substantially parallel to one side of the core portion to penetrate at least a portion of the core portion, forming an insulating layer to cover the first and second surfaces of the core portion and fill the cutting regions, and forming circuit patterns on the insulating layer.

In some embodiments, the forming of the cutting regions may include forming first cutting regions on the first surface of the core portion to extend in a second direction substantially perpendicular to the first direction, to completely penetrate the core portion in the thickness direction of the core portion, and to have a slit-type structure.

In some embodiments, the forming of the cutting regions may further include forming second cutting regions on the first surface of the core portion to extend in the first direction, to cross the first cutting regions, to completely penetrate the core portion in the thickness direction of the core portion, and to have a slit-type structure, and the second cutting regions may be formed spaced apart from each other in the second direction.

In some embodiments, the forming of the cutting regions may include forming first cutting regions on the first surface of the core portion to extend in a second direction substantially perpendicular to the first direction, to partially penetrate the core portion in a thickness direction from the first surface of the core portion toward the second surface, to be opened toward the first surface of the core portion, to be spaced apart from the second surface of the core portion, and to have a trench-type structure.

In some embodiments, the forming of the cutting regions may further include forming second cutting regions on the first surface of the core portion to extend in the first direction, to cross the first cutting regions, to partially penetrate the core portion in the thickness direction of the core portion, to be opened toward the first surface of the core portion, to be spaced apart from the second surface of the core portion, and to have a trench-type structure, and the second cutting regions may be formed spaced apart from each other in the second direction.

In some embodiments, the core portion may further include a first upper circuit pattern provided on the first surface and covered with the insulating layer, and the forming of the circuit patterns may include forming a second upper circuit pattern on the insulating layer to cover the first surface of the core portion and to be electrically connected to the first upper circuit pattern.

In some embodiments, the core portion may further include a first lower circuit pattern provided on the second surface and covered with the insulating layer, and the forming of the circuit patterns may further include forming a second lower circuit pattern on the insulating layer to cover the second surface of the core portion and to be electrically connected to the first lower circuit pattern.

In some embodiments, the core portion may include circuit portions and a connecting portion between the circuit portions, and the forming of the cutting regions may include forming cutting a portion of the core portion corresponding to the connecting portion along the second direction to form first cutting regions.

In some embodiments, the forming of the cutting regions may further include cutting a portion of the core portion corresponding to the connecting portion along a first direction crossing the second direction to form second cutting regions crossing the first cutting regions.

In some embodiments, at least one of the first and second cutting regions may be formed to have a line-shaped structure continuously or discontinuously extending along the first surface of the core portion.

In some embodiments, the forming of the insulating layer may include providing an insulating material on the first and second surfaces of the core portion and thermally compressing the insulating material to fill the cutting region with the insulating material and to cure the insulating material filling the cutting region.

According to example embodiments of the inventive concept, a method of fabricating a package substrate is provided. The method may include providing a substrate including circuit portions provided with circuit patterns, a connecting portion separating the circuit portions, and an insulating layer covering the circuit and connecting portions, and cutting a portion of the substrate to form cutting regions between the circuit portions. The cutting regions may be formed in the connecting portion between the circuit portions to expose inside portions (or inside sidewalls) of the substrate corresponding to the connecting portion and may be formed spaced apart from the circuit patterns.

In some embodiments, the forming of the cutting regions may include forming a plurality of first cutting regions extending in a second direction crossing a top surface of the substrate and spaced apart from each other in a first direction crossing the second direction. The circuit portions may be arranged between an adjacent pair of the first cutting regions and along the first direction to form at least one column.

In some embodiments, the forming of the cutting regions may include forming a plurality of second cutting regions extending in the first direction and spaced apart from each other in the second direction crossing the first cutting regions. The circuit portions may be arranged between an adjacent pair of the second cutting regions and along the second direction to form at least one row.

In some embodiments, the forming of the cutting regions may include forming trench-type cutting regions, which may be recessed in a thickness direction from the top surface of the substrate toward the bottom surface of the substrate and may be spaced apart from the bottom surface of the substrate.

In some embodiments, the forming of the cutting regions may include forming trench-type cutting regions, which may be recessed in a thickness direction from the bottom surface of the substrate toward the top surface of the substrate and may be spaced apart from the top surface of the substrate.

In some embodiments, before the forming of the cutting regions, the method may further include forming a protection layer covering the insulating layer and partially exposing the circuit patterns.

According to example embodiments of the inventive concept, a package substrate may be provided. The package substrate may include a core portion with top and bottom surfaces opposite to each other. The core portion may include circuit portions, which may be arranged in a matrix shape on the top surface, and a connecting portion between the circuit portions. Furthermore, the substrate may include a plurality of first cutting regions, which may be provided on the connecting portion to extend in a second direction crossing the top surface and are spaced apart from each other in a first direction substantially perpendicular to the second direction. The first cutting regions may be provided to expose inside portions (or inner sidewalls) of the connecting portion and to prevent a stress applied to the substrate from being transferred between the circuit portions.

In some embodiments, the first cutting regions may be spaced apart from each other, by a predetermined distance in the first direction.

In some embodiments, the package substrate may further include second cutting regions provided between the circuit portions to extend along the first direction, which are spaced apart from each other in the second direction, and intersect the first cutting regions.

According to another aspect, a package substrate is provided. The package substrate may comprise a core portion having a top surface and a bottom surface opposite to the top surface; circuit portions on the core portion, wherein the circuit portions are arranged in a matrix shape having a plurality of rows in a first direction substantially parallel to one side of the core portion and a plurality of columns in a second direction substantially perpendicular to the first direction; circuit patterns provided on the circuit portions; a plurality of first cutting regions disposed between the columns of the circuit portions and spaced apart from each other in the first direction, wherein each of the first cutting regions comprises an opening extending in the second direction and at least partially penetrating the core portion in a thickness direction; and an insulating layer overlying the core portion and filling the cutting regions.

In one embodiment, a length of each of the plurality of first cutting regions may be greater than a length of a corresponding one of the plurality of circuit portions in the second direction.

In another embodiment, at least one first cutting region may extend across at least two rows of the circuit portions.

In another embodiment, at least two columns of the circuit portions may be disposed between two adjacent first cutting regions.

In another embodiment, at least one first cutting region may include a plurality of first segments, and each first segment may have a length greater than a length of a corresponding one of circuit portions in the second direction.

In another embodiment, at least two columns of the circuit portions may be disposed between two adjacent first cutting regions.

In another embodiment, the package substrate may further comprise a plurality of second cutting regions disposed between the rows of the circuit portions and spaced apart from each other in the second direction. Each of the second cutting regions may be an opening extending in the first direction and at least partially penetrating the core portion in the thickness direction. At least one second cutting region may extend across at least two columns of the circuit portions.

In another embodiment, the package substrate may further comprise a plurality of second cutting regions disposed between the rows of the circuit portions and spaced apart from each other in the second direction. Each of the second cutting regions may be an opening extending in the first direction and at least partially penetrating the core portion in the thickness direction. At least one second cutting region may include a plurality of second segments, and each second segment may have a length greater than a length of a corresponding one of the circuit portions in the first direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5A through 5D are sectional views illustrating a method of fabricating a package substrate, according to an embodiment of the inventive concept.

FIGS. 8A through 8F are plan views illustrating a package substrate, according to modifications of an embodiment of the inventive concept.

Figure 1:
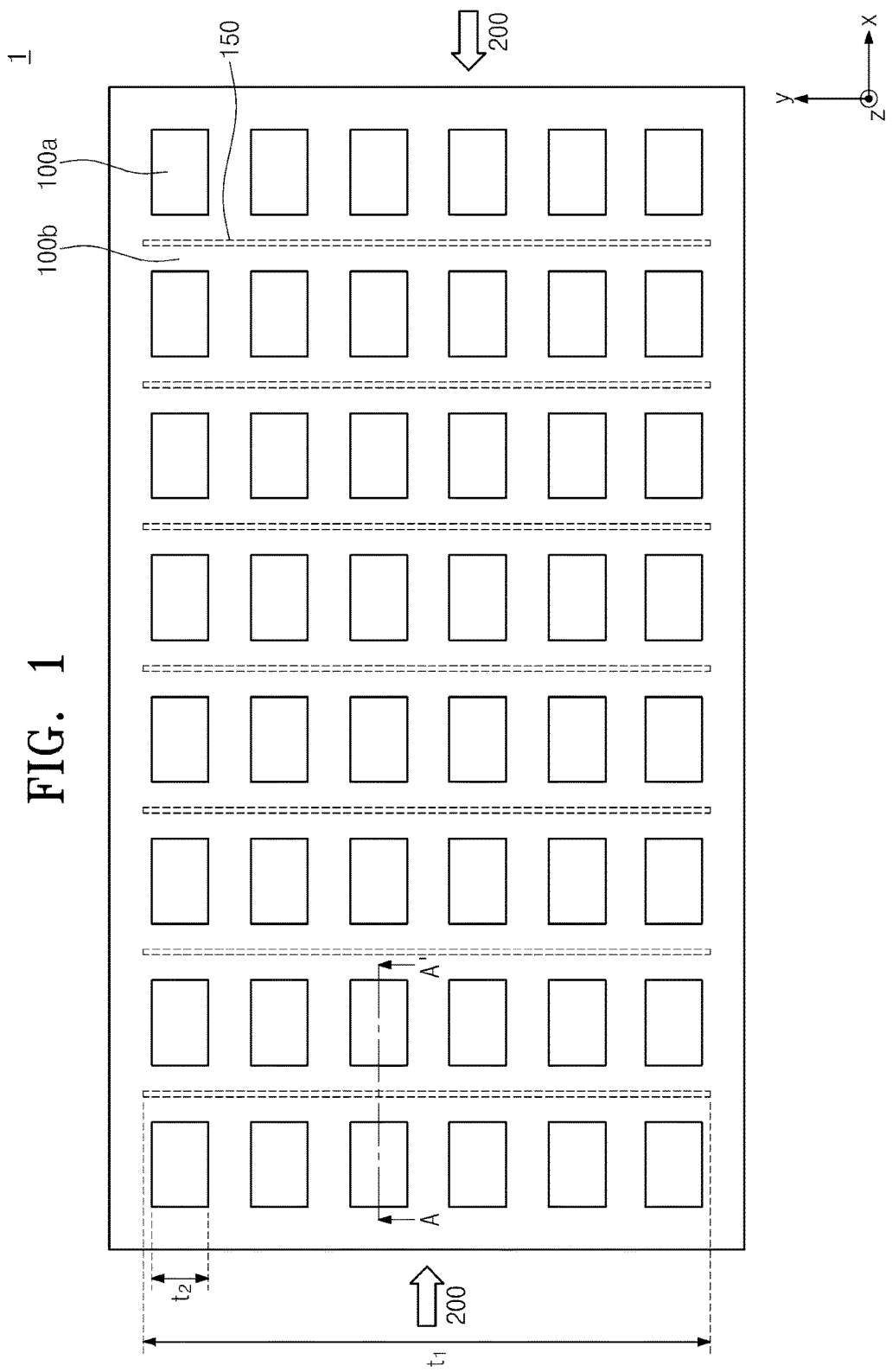
FIG. 1 is a plan view illustrating a package substrate according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, preferred embodiments of the present invention will be described in more detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etch region illustrated with right angles may be rounded or be configured with a predetermined curvature. Therefore, areas exemplified in the drawings have general properties, and are used to illustrate specific shapes of certain regions. Thus, this should not be construed as limited to the scope of the present invention.

Figure 2:
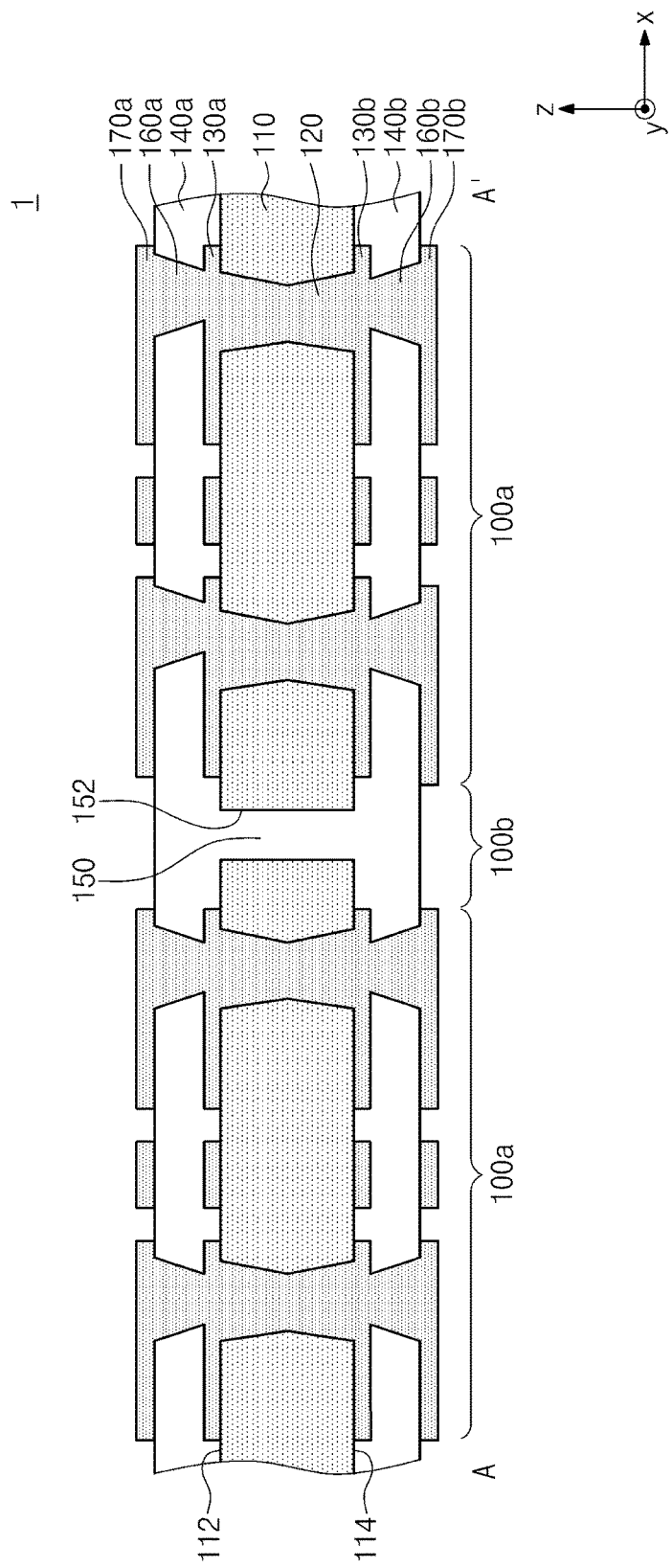
FIG. 2 is a sectional view taken along line A-A' of FIG. 1.

FIG. 1 is a plan view illustrating a package substrate according to an embodiment of the inventive concept, and FIG. 2 is a cross-sectional view taken along line A-A' of FIG. 1.

Referring to FIGS. 1 and 2, a package substrate 1 may include circuit portions 100a and a connecting portion 100b connecting the circuit portions 100a to each other. Each of the circuit portions 100a may provide a mounting region for a semiconductor chip. The circuit portions 100a may be spaced apart from each other by a specific space or a predetermined distance and may be arranged in a matrix shape. In some embodiments, the circuit portions 100a may be arranged to have a plurality of rows arranged in a first direction (or a row direction) x that is substantially parallel to one side (or edge) of the core portion and a plurality of columns arranged in a second direction (or a column direction) y that is substantially perpendicular to the first direction when viewed in plan view. The circuit portions 100a may include circuit patterns 130a, 130b, 170a, and 170b. The number of the circuit portions 100a arranged on the package substrate 1 may not be limited to a specific value. The connecting portion 100b may be provided between the circuit portions 100a to connect the circuit portions 100a to each other. The connecting portion 100b may allow a stress occurring between the circuit portions 100a to be transmitted therethrough. In some embodiments, the circuit patterns 130a, 130b, 170a, and 170b may not be provided in the connecting portion 100b.

The package substrate 1 may include a core portion 110, a first via 120, first circuit patterns 130a and 130b, insulating layers 140a and 140b, cutting regions 150, second vias 160a and 160b, and second circuit patterns 170a and 170b.

The core portion 110 may be a substrate and include a glass fiber or a resin. The glass fiber may be a fiber bundle, which is formed by weaving several hundreds of glass filaments having a diameter of approximately between about 5 μm to about 15 μm. The glass filament may be a silica-based ore product. The glass fiber may have a good heat-resistant property, a good mechanical strength, and a good electric insulating property.

Circuit patterns may be provided on the core portion. In some embodiments, first circuit patterns 130a and 130b may be provided on the core portion 110. The first circuit patterns 130a and 130b may be formed of or include a plating material (e.g., nickel (Ni) or copper (Cu)) or a polymer material with a good thermal conductive property. The first circuit patterns 130a and 130b may include the first upper circuit pattern 130a disposed on a top surface 112 of the core portion 110 and the first lower circuit pattern 130b disposed on a bottom surface 114 of the core portion 110. The first upper circuit pattern 130a and the first lower circuit pattern 130b may be electrically connected to each other through the first via 120. The first via 120 may penetrate or extend through the core portion 110 in a thickness direction. The first via 120 may be formed of or include a plating material (e.g., nickel (Ni) or copper (Cu)) or a polymer material with a good thermal conductive property.

The insulating layers 140a and 140b may be provided on the first circuit patterns 130a and 130b, and the top surface 112 and the bottom surface 114 of the core portion 110, respectively. The insulating layers 140a and 140b may include the upper insulating layer 140a disposed on the first upper circuit pattern 130a and the lower insulating layer 140b disposed on the first lower circuit pattern 130b. The insulating layers 140a and 140b may be formed of or include a resin.

In the core portion 110, the cutting regions 150 may be provided to penetrate the core portion 110. Each of the cutting regions 150 may be, for example, a slit-type opening or an elongated opening penetrating the core portion 110 in a thickness direction. The thickness direction refers to a direction substantially perpendicular to the top surface 112 or the bottom surface 114 of the core portion 110. In some embodiments, the cutting region 150 may be defined by the exposed inside portions (or inner sidewalls) 152 of the core portion 110. In an example embodiment, the cutting regions 150 may completely penetrate (i.e., penetrate through) the core portion 110. The cutting regions 150 may be provided in the connecting portion 100b of the package substrate 1. The cutting regions 150 may be spaced apart from each other in a first direction x (e.g., parallel to the core portion 110). The cutting regions 150 may be spaced apart from each other by a specific space or a predetermined distance in the first direction x. Between each adjacent pair of the cutting regions 150, the circuit portions 100a may be arranged to form a single column that may be substantially parallel to a second direction y and substantially perpendicular to the first direction x. As an example, when viewed in plan view, the cutting regions 150 may be spaced apart from each other in the first direction x, and each of the cutting regions 150 may have a line-shaped structure extending substantially in the second direction y. An extension length t1 of the cutting regions 150 (a length of the cutting regions 150 in the second direction) may be longer than a length t2 of the circuit portion 100a in the second direction y. The cutting regions 150 may be filled with the same insulating material as the insulating layers 140a and 140b, such as a resin, for example. Each of the cutting regions 150 may substantially prevent a compressive or tensile stress applied to the core portion 110 or circuit portion 100a in the first direction x from being transferred to a neighboring region. An extension direction of the cutting regions 150 may be substantially perpendicular to a main applying direction 200 of a stress (e.g., a compressive stress) applied to the package substrate 1. Since the stress applied to the core portion 110 or the circuit portion 100a is disconnected, it may be possible to substantially prevent the package substrate 1 from being shrunk or bent in the process.

The second circuit patterns 170a and 170b may be respectively provided on the insulating layers 140a and 140b. The second circuit patterns 170a and 170b may include the second upper circuit pattern 170a disposed on the top surface of the upper insulating layer 140a and the second lower circuit pattern 170b disposed on the bottom surface of the lower insulating layer 140b. The second circuit patterns 170a and 170b may be formed of or include a plating material (e.g., nickel (Ni) or copper (Cu)) or a polymer material with a good thermal conductive property.

The second vias 160a and 160b may include the second upper via 160a penetrating the upper insulating layer 140a and the second lower via 160b penetrating the lower insulating layer 140b, respectively. The second upper circuit pattern 170a may be electrically connected to the first upper circuit pattern 130a through the second upper via 160a, and the second lower circuit pattern 170b may be electrically connected to the first lower circuit pattern 130b through the second lower via 160b. The second vias 160a and 160b may be formed of or include a plating material (e.g., nickel (Ni) or copper (Cu)) or a polymer material with a good thermal conductive property.

In an embodiment, the package substrate 1 may have a double-layered structure. Alternatively, the package substrate 1 may be provided to have a single- or multi-layered structure.

FIGS. 3A through 3D are cross-sectional views illustrating a method of fabricating a package substrate, according to an embodiment of the inventive concept.

Figure 3A:
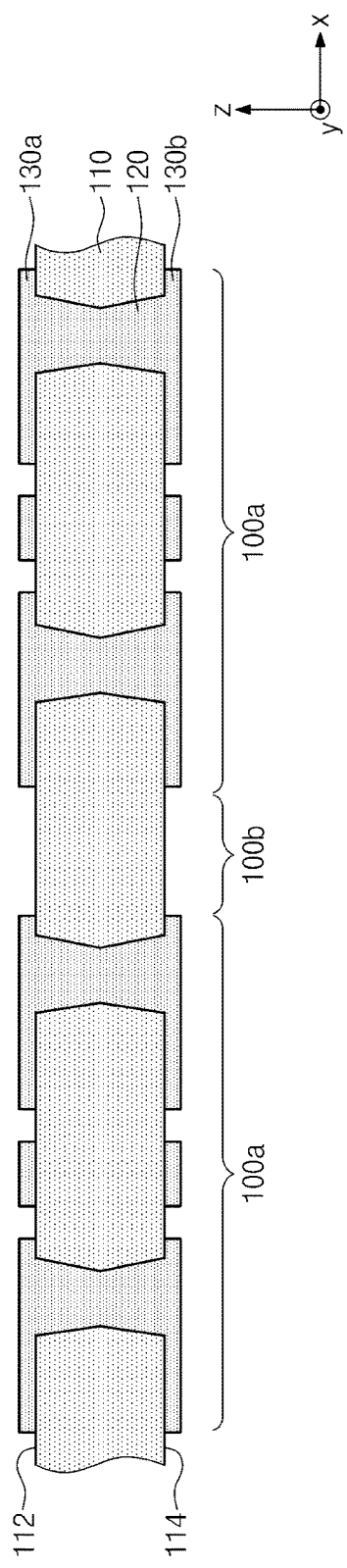
FIGS. 3A through 3D are sectional views illustrating a method of fabricating a package substrate, according to an embodiment of the inventive concept.

Referring to FIG. 3A, the first via 120 may be formed to penetrate the core portion 110, and the first circuit patterns 130a and 130b may be formed to be electrically connected to the first via 120. For example, the formation of the first via 120 may include forming a hole penetrating the core portion 110 (for example, using a laser drilling process) and filling the hole with a conductive material. The conductive material may be, for example, a plating material (e.g., nickel (Ni) or copper (Cu)) or a polymer material with a good thermal conductive property. The first upper circuit pattern 130a may be formed on the top surface 112 of the core portion 110, and the first lower circuit pattern 130b may be formed on the bottom surface 114 of the core portion 110. The first upper circuit pattern 130a and the first lower circuit pattern 130b may be electrically connected to each other through the first via 120.

Figure 3B:
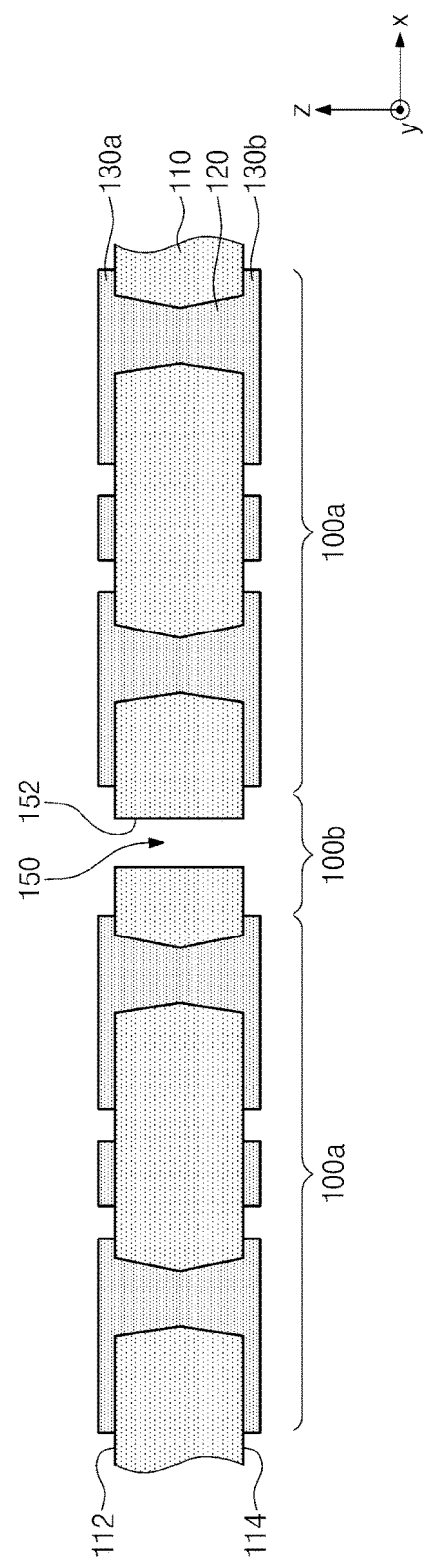

Referring to FIG. 3B, at least a portion of the core portion 110 may be cut to form the cutting region 150. In the example embodiment, the cutting region 150 may completely penetrate the core portion 110. The cutting region 150 may be formed to expose the inside portions (or inner sidewalls) 152 of the core portion 110. The cutting region 150 may be formed to have a slit-type structure. The cutting region 150 may be formed using a sawing process using, for example, a saw blade, a laser cutting process, or a laser drilling process. In some embodiments, the cutting region 150 may be formed in such a way that the circuit portion 100a or the first circuit patterns 130a and 130b provided on the core portion 110 are not cut. The cutting region 150 may be formed to have a line-shaped structure extending in the second direction y, as shown in FIG. 1.

Figure 3C:
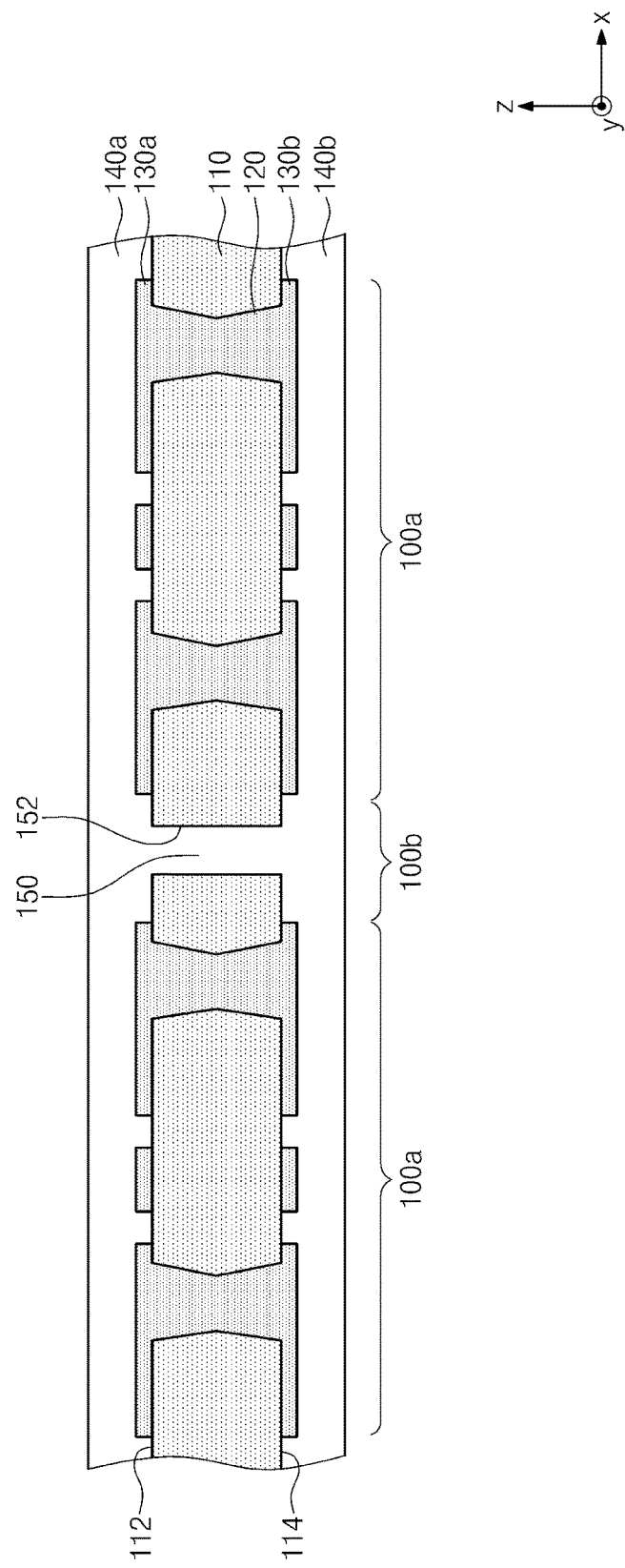

Referring to FIG. 3C, the insulating layers 140a and 140b may be formed on the core portion 110 and the first circuit patterns 130a and 130b. As an example, an insulating material may be provided on the core portion 110 and the first circuit patterns 130a and 130b and then may be thermally compressed to fill the cutting region 150. The insulating material may include a resin, and the thermal compression process may be performed at a temperature ranging approximately from about 130° C. to about 250° C. An insulating material provided on the core portion 110, the first circuit patterns 130a and 130b, and the cutting region 150 may be cured to form the upper insulating layer 140a and the lower insulating layer 140b on the first upper circuit pattern 130a and the first lower circuit pattern 130b, respectively. During the formation of the insulating layers 140a and 140b, the cutting region 150 may be filled with the insulating material, without an additional process. Accordingly, it is possible to simplify a fabrication process and reduce the manufacturing costs.

Figure 3D:
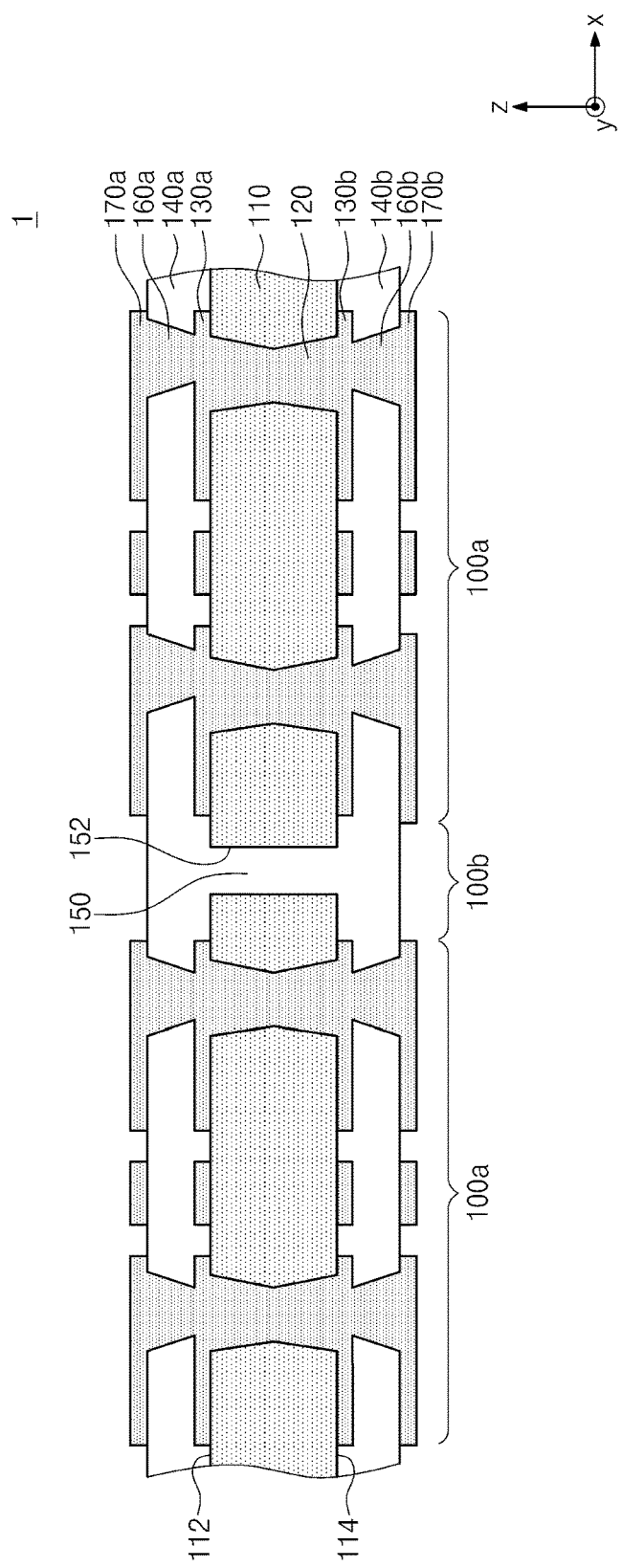

Referring to FIG. 3D, the second vias 160a and 160b may be formed to penetrate the insulating layers 140a and 140b, respectively, and the second circuit patterns 170a and 170b may be formed on the insulating layers 140a and 140b, or formed to cover the insulating layers 140a and 140b, respectively. For example, the second upper via 160a may be formed to penetrate the upper insulating layer 140a. The second upper circuit pattern 170a may be electrically connected to the second upper via 160a. The second upper via 160a may be formed by forming a hole penetrating the upper insulating layer 140a (e.g., using a laser drilling process) and filling the hole with a conductive material. For example, the conductive material may be a plating material (e.g., nickel (Ni) or copper (Cu)) or a polymer material with a good thermal conductive property. The second upper circuit pattern 170a may be electrically connected to the first upper circuit pattern 130a through the second upper via 160a. The second lower via 160b may be formed to penetrate the lower insulating layer 140b. The second lower circuit pattern 170b may be electrically connected to the second lower via 160b. The second lower via 160b may be formed by forming a hole penetrating the lower insulating layer 140b (e.g., using a laser drilling process) and filling the hole with a conductive material. The second lower circuit pattern 170b may be electrically connected to the first lower circuit pattern 130*b* through the second lower via 160*b*.

The package substrate 1 may be fabricated through a series of steps described below. The package substrate 1 may be divided into the circuit portions 100*a*, on which a semiconductor chip is mounted, and the connecting portion 100*b*, which may be provided between the circuit portions 100*a* to include the cutting region 150. The cutting region 150 may be configured to substantially prevent a stress from being transferred between the circuit portions 100*a*. Accordingly, it may be possible to substantially prevent the package substrate 1 from being shrunk and bent. Furthermore, it may be possible to substantially prevent the package substrate 1 from being broken and being damaged, when the package substrate 1 is delivered during a package-assembling process.

Figure 4:
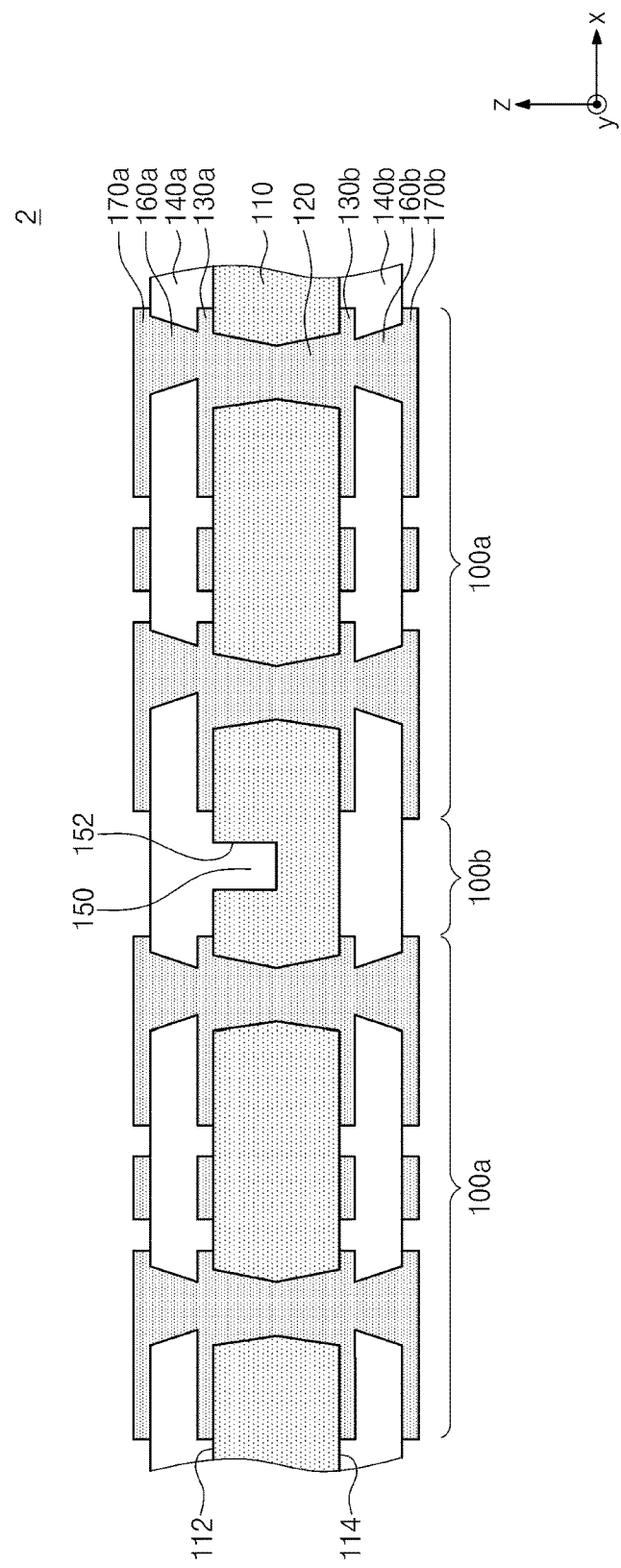
FIG. 4 is a sectional view illustrating a package substrate according to an embodiment of the inventive concept.

FIG. 4 is a cross-sectional view illustrating a package substrate according to an embodiment of the inventive concept. For the sake of brevity, in this example, the elements and features similar to those previously shown and described will not be described in much further detail.

Referring to FIG. 4, a package substrate 2 may include the core portion 110, the first via 120, the first circuit patterns 130*a* and 130*b*, the insulating layers 140*a* and 140*b*, the cutting region 150, the second vias 160*a* and 160*b*, and the second circuit patterns 170*a* and 170*b*. The cutting region 150 may have a line-shaped structure extending in the second direction y, as shown in FIG. 1. The package substrate 2 may be provided to have a planar shape that is substantially equal or similar to that of the package substrate 1 of FIG. 1.

The cutting region 150 may be provided in the core portion 110 to partially penetrate the core portion 110 in a thickness direction of the core portion 110. The cutting region 150 may be formed to have a trench-shaped structure. For example, the cutting region 150 may be formed to partially penetrate the core portion 110 in a thickness direction of the core portion 110 and may be formed by cutting an upper portion of the core portion 110. The cutting region 150 may be opened toward the top surface 112 of the core portion 110 and may be spaced apart from the bottom surface 114 of the core portion 110. The cutting region 150 may be formed to expose the inside portions (or inner sidewalls) 152 of the core portion 110. The cutting region 150 may be provided in the connecting portion 100*b* of the package substrate 2. The cutting region 150 may be formed by a laser cutting process or a laser drilling process. The cutting region 150 may be formed to have an appropriate depth considering factors such as a thickness of the core portion 110, a material of the core portion 110, a thickness of the package substrate 2, and so forth.

Each of the first via 120, the first circuit patterns 130*a* and 130*b*, the insulating layers 140*a* and 140*b*, the second vias 160*a* and 160*b*, and the second circuit patterns 170*a* and 170*b* provided on the core portion 110 may be configured to have the same or similar structures as a corresponding one described with reference to FIGS. 1 and 2.

FIGS. 5A through 5D are cross-sectional views illustrating a method of fabricating a package substrate, according to an embodiment of the inventive concept. For the sake of brevity, in this example, the elements and features similar to those previously shown and described will not be described in much further detail.

Referring to FIG. 5A, the first upper circuit pattern 130*a* may be formed on the top surface 112 of the core portion 110, and the first lower circuit pattern 130*b* may be formed on the bottom surface 114 of the core portion 110.

Referring to FIG. 5B, the cutting region 150 may be formed by partially cutting an upper portion of the core portion 110. The cutting region 150 may be formed to have a trench-shaped structure exposing the inside portions (or inner sidewalls) 152 of the core portion 110. The cutting region 150 may be formed by a laser cutting process or a laser drilling process and may have a line-shaped structure continuously extending in the second direction y, as shown in FIG. 1. In some embodiments, the formation of the cutting region 150 may be performed in such a way that the first circuit patterns 130*a* and 130*b* provided on the core portion 110 are not cut.

Referring to FIG. 5C, the insulating layers 140*a* and 140*b* may be formed on corresponding ones of the core portion 110 and the first circuit patterns 130*a* and 130*b*. The formation of the insulating layers 140*a* and 140*b* may include providing an insulating material on the core portion 110 and the first circuit patterns 130*a* and 130*b*. The insulating material may include, for example, a resin. The insulating material provided on the first upper circuit pattern 130*a* may be thermally compressed to fill the cutting region 150. For example, the thermal compression process may be performed at a temperature ranging approximately from about 130° C. to about 250° C. The insulating material provided on the core portion 110, the first upper circuit patterns 130*a*, and the cutting region 150 may be cured to form the upper insulating layer 140*a*. The insulating material provided on the first lower circuit pattern 130*b* may be thermally compressed and cured to form the lower insulating layer 140*b* on the first lower circuit pattern 130*b*. During the formation of the upper insulating layer 140*a*, the cutting region 150 may be filled with the insulating material, without an additional process. Accordingly, it is possible to simplify a fabrication process and reduce a cost of the fabrication process.

Figure 5D:
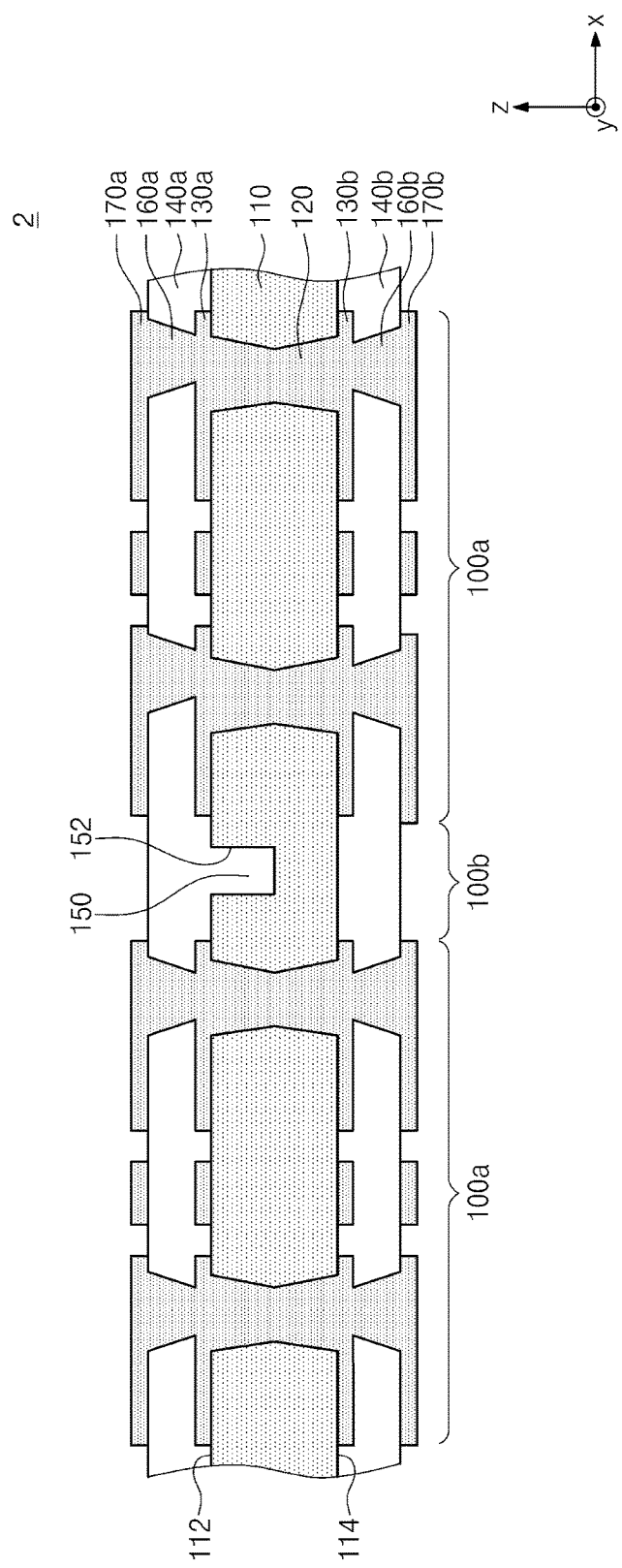

Referring to FIG. 5D, the second circuit patterns 170*a* and 170*b* may be formed on the insulating layers 140*a* and 140*b*, respectively. For example, the second upper via 160*a* may be formed to penetrate the upper insulating layer 140*a*, and the second upper circuit pattern 170*a* may be formed to be electrically connected to the second upper via 160*a*. The second lower via 160*b* may be formed to penetrate the lower insulating layer 140*b*, and the second lower circuit pattern 170*b* may be formed to be electrically connected to the second lower via 160*b*.

Figure 6A:
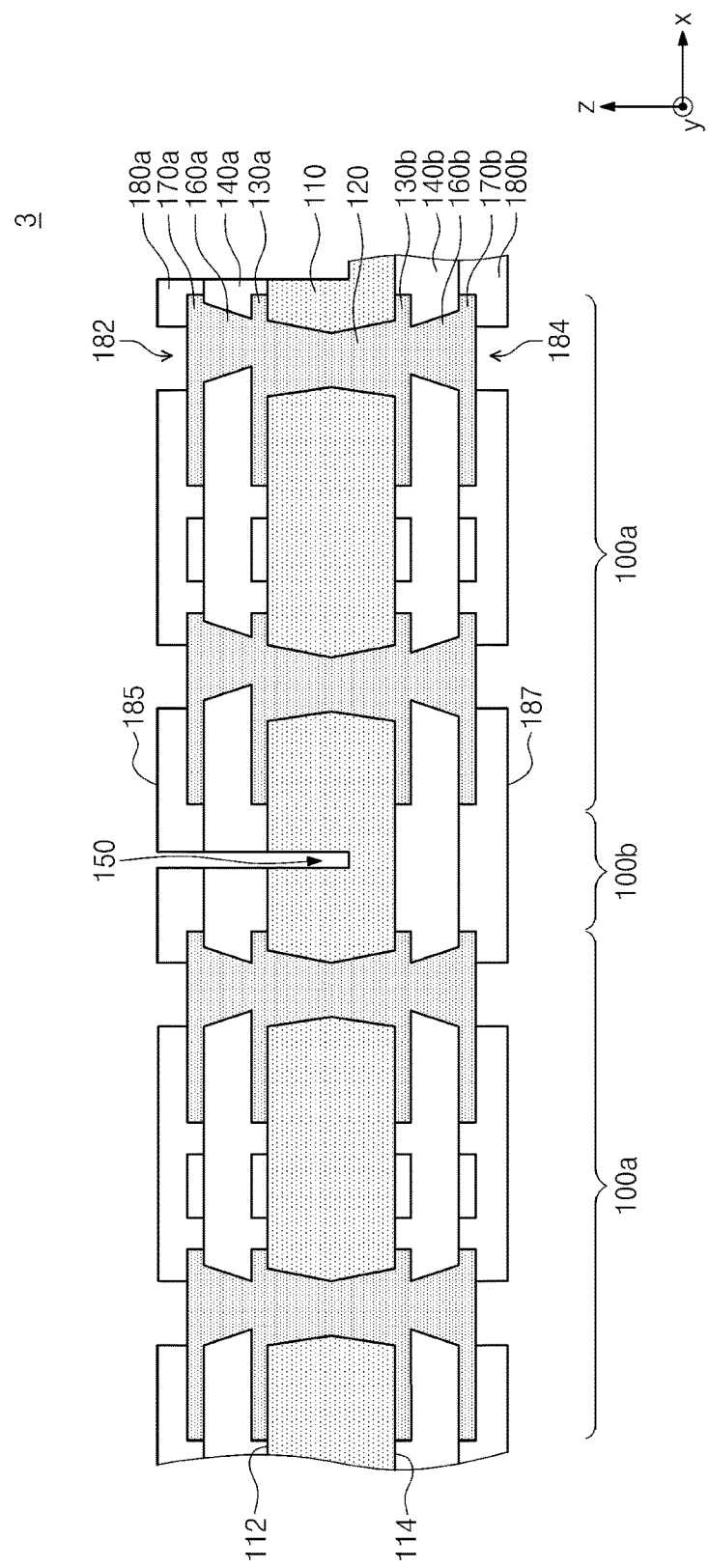
FIGS. 6A and 6B are sectional views illustrating a package substrate according to an embodiment of the inventive concept.
Figure 6B:
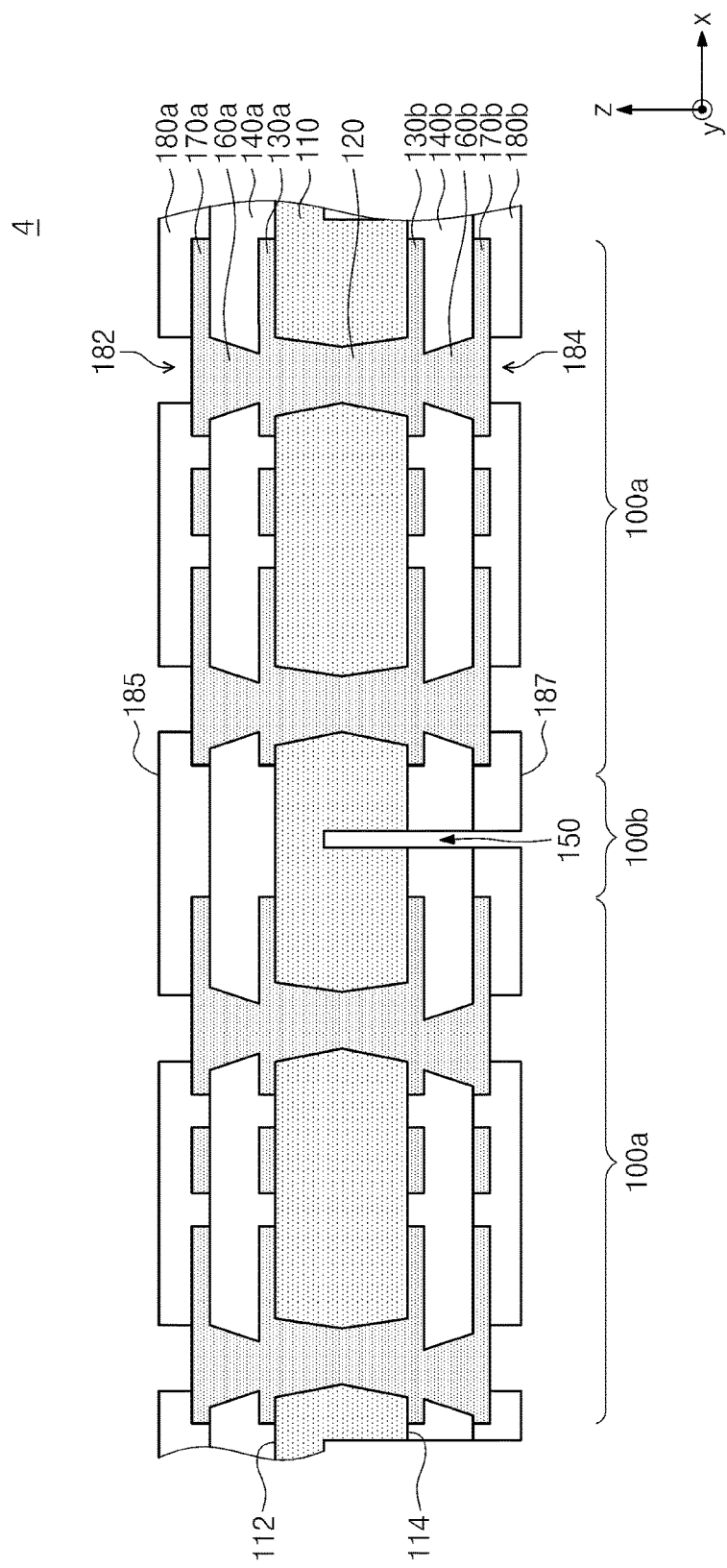

FIGS. 6A and 6B are cross-sectional views illustrating a package substrate according to an embodiment of the inventive concept. For the sake of brevity, in this example, the elements and features similar to those previously shown and described will not be described in much further detail.

Referring to FIG. 6A, a package substrate 3 may include the circuit portions 100*a* for mounting semiconductor chips, and the connecting portion 100*b* for connecting the circuit portions 100*a* to each other.

The circuit portions 100*a* may include the core portion 110, the first via 120, the first circuit patterns 130*a* and 130*b*, the insulating layers 140*a* and 140*b*, the second vias 160*a* and 160*b*, the second circuit patterns 170*a* and 170*b*, and protection layers 180*a* and 180*b*. The protection layers 180*a* and 180*b* may be formed of or include an insulating coating layer (e.g., photo-solder resist (PSR) or Prepreg). The protection layers 180*a* and 180*b* may protect the circuit patterns and may substantially prevent a solder bridge from occurring between the circuit patterns. The protection layers 180*a* and 180*b* may include the upper protection layer 180*a* disposed on the second upper circuit pattern 170*a* and the insulation layer 140*a* and the lower protection layer 180*b* disposed on the second lower circuit pattern 170b and insulation layer 140b. The upper protection layer 180a may have an opening 182 to expose a portion of the second upper circuit pattern 170a, and the lower protection layer 180b may have another opening 184 to expose a portion of the second lower circuit pattern 170b.

The connecting portion 100b may include portions of the core portion 110, the insulating layers 140a and 140b, the cutting region 150, and the protection layers 180a and 180b. The cutting region 150 may be formed after the build-up of the package substrate 3. The cutting region 150 may have a line-shaped structure continuously extending in the second direction y, as shown in FIG. 1. The cutting region 150 may be provided to penetrate the upper insulating layer 140a and the upper protection layer 180a and may be formed by cutting a portion of the core portion 110. The cutting region 150 may be recessed from a top surface 185 of the package substrate 3 and may be spaced apart from a bottom surface 187 of the package substrate 3. The cutting region 150 may not be in contact with the circuit patterns 130a, 130b, 170a, and 170b.

Referring to FIG. 6B, a package substrate 4 may have a structure similar to that of the package substrate 3 of FIG. 6A. Unlike the package substrate 3, the package substrate 4 may include the cutting region 150, which is provided to penetrate the lower insulating layer 140b and the lower protection layer 180b and to cut a portion of the core portion 110. For example, the cutting region 150 may be recessed from the bottom surface 187 of the package substrate 4 and may be spaced apart from the top surface 185 of the package substrate 4. The cutting region 150 may not be in contact with the circuit patterns 130a, 130b, 170a, and 170b or, in other words, may be spaced apart from the circuit patterns 130a, 130b, 170a, and 170b. The cutting region 150 may have a line-shaped structure continuously extending in the second direction y, as shown in FIG. 1.

Figure 7A:
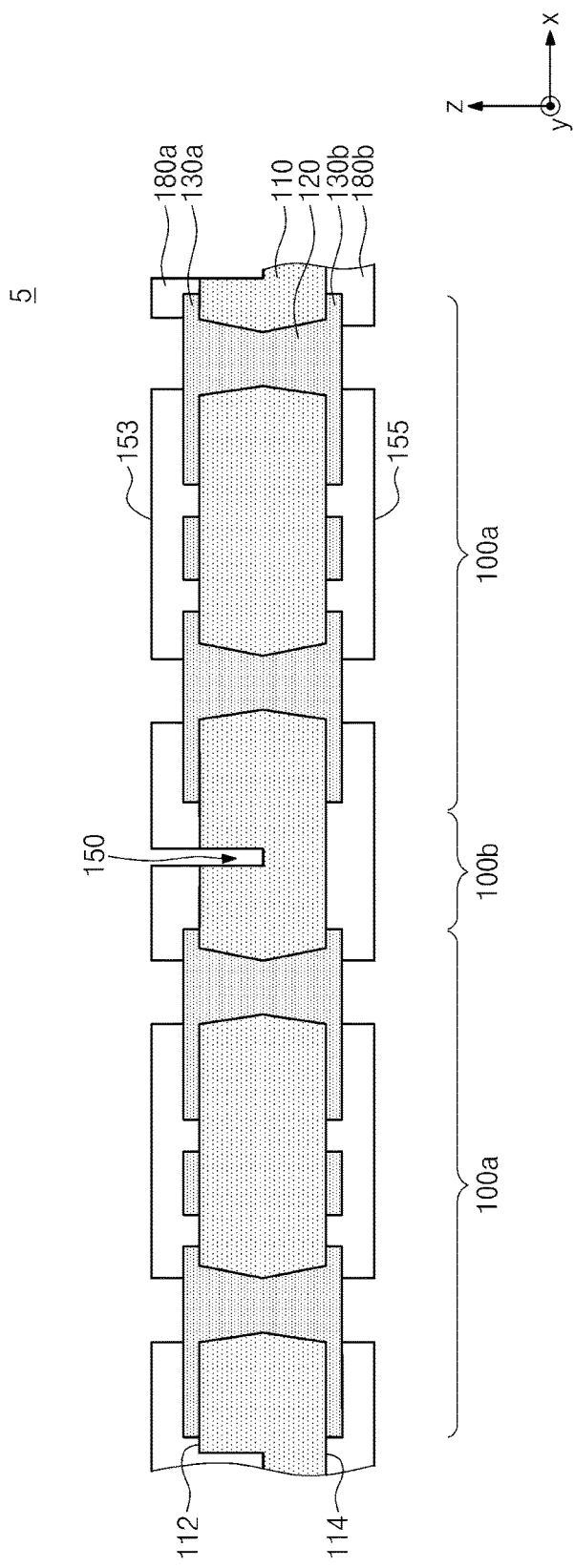
FIGS. 7A and 7B are sectional views illustrating a package substrate according to an embodiment of the inventive concept.
Figure 7B:
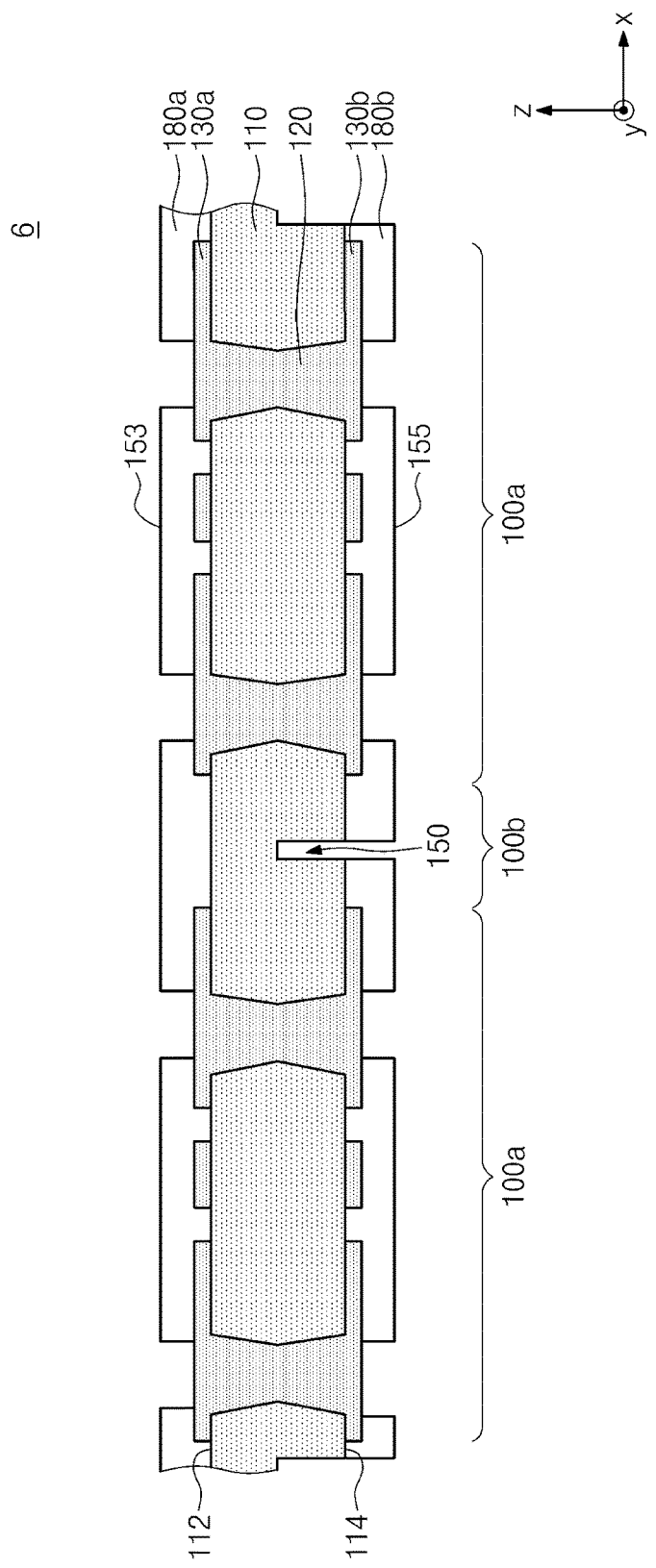

FIGS. 7A and 7B are cross-sectional views illustrating a package substrate according to an embodiment of the inventive concept. For the sake of brevity, in this example, the elements and features similar to those previously shown and described will not be described in much further detail.

Referring to FIG. 7A, a package substrate 5 may include circuit portions 100a providing mounting regions for semiconductor chips, and connecting portion 100b connecting the circuit portions 100a to each other.

The circuit portions 100a may include the core portion 110, the first via 120, the first circuit patterns 130a and 130b, and the protection layers 180a and 180b. The first circuit patterns 130a and 130b may be provided on the core portion 110. The first circuit patterns 130a and 130b may include the first upper circuit pattern 130a disposed on the top surface 112 of the core portion 110 and the first lower circuit pattern 130b disposed on the bottom surface 114 of the core portion 110. The first upper circuit pattern 130a and the first lower circuit pattern 130b may be electrically connected to each other through the first via 120. The first via 120 may penetrate the core portion 110. The protection layers 180a and 180b may include the upper protection layer 180a disposed on the first upper circuit pattern 130a and the lower protection layer 180b disposed on the first lower circuit pattern 130b.

The connecting portion 100b may include portions of the core portion 110, the cutting region 150, and the protection layers 180a and 180b. As shown in FIG. 1, the cutting region 150 may have a line-shaped structure continuously extending in the second direction y. The cutting region 150 may be provided to penetrate the upper protection layer 180a and may be formed by cutting a portion of the core portion 110. The cutting region 150 may be recessed from the top surface 153 of the package substrate 5 and may be spaced apart from the bottom surface 155 of the package substrate 5. The cutting region 150 may be spaced apart from the first circuit patterns 130a and 130b.

Referring to FIG. 7B, the package substrate 6 may have a structure similar to that of the package substrate 5 of FIG. 7A. Unlike the package substrate 5 of FIG. 7A, the package substrate 6 may include the cutting region 150, which is provided to penetrate the lower protection layer 180a and which may be formed by partially cutting a bottom portion of the core portion 110. The cutting region 150 may be recessed from the bottom surface 155 of the package substrate 6 and may be spaced apart from the top surface 153 of the package substrate 6. The cutting region 150 may be formed spaced apart from the first circuit patterns 130a and 130b. The cutting region 150 may have a line-shaped structure continuously extending in the second direction y, as shown in FIG. 1.

FIGS. 8A through 8E are plan views illustrating a package substrate, according to modifications of an embodiment of the inventive concept.

Referring to FIG. 8A, the cutting regions 150 may continuously extend in the second direction y and may be spaced apart from each other in the first direction x. The circuit portions 100a may be arranged to form a plurality of rows substantially parallel to the first direction x and a plurality of columns substantially parallel to the second direction y. In some embodiments, at least one first cutting region may extend across at least two rows of the circuit portions 100a. For example, between each adjacent pair of the cutting regions 150, the circuit portions 100a may be arranged to form a plurality of columns (e.g., two columns) substantially parallel to the second direction y. In some embodiments, at least two columns may be arranged between two adjacent cutting regions 150. The cutting regions 150 may extend substantially perpendicular to the main applying direction 200 of a stress (e.g., a compressive stress) applied to the package substrate. The cutting regions 150 may have an extension length t1 that is longer than a length t2 of the circuit portion 100a in the second direction y.

Referring to FIG. 8B, the cutting regions 150 may include a first cutting region 150a continuously extending in the second direction y and a second cutting region 150b continuously extending in the first direction x. In some embodiments, at least one first cutting region 150a may extend across at least two rows of the circuit portions 100a. In some embodiments, at least one second cutting region 150b may extend across at least two columns of the circuit portions 100a. In some embodiments, at least one column of circuit portions 100a may be arranged between two adjacent first cutting regions 150a. In some embodiments, at least two columns of circuit portions 100a may be arranged between two adjacent first cutting regions 150a. Similarly, in some embodiments, at least one row of the circuit portions 100a may be arranged between two adjacent second cutting regions 150b. The first cutting regions 150a may extend substantially perpendicularly to a main first applying direction 200a of a stress (e.g., a compressive stress) applied to the package substrate, and the second cutting regions 150b may extend substantially perpendicular to a main second applying direction 200b of a stress (e.g., a compressive stress) applied to the package substrate. The extension length t1 of the first cutting regions 150a may be longer than the length t2, in the second direction y, of the circuit portion 100*a* providing the mounting region allowing for mounting of a semiconductor chip, and an extension length t3 of the second cutting regions 150*b* may be longer than a length t4 of the circuit portion 100*a* in the first direction x.

Referring to FIG. 8C, the cutting regions 150 may discontinuously extend in the second direction y and may be spaced apart from each other in the first direction x. The circuit portions 100*a* may be arranged to form a plurality of rows substantially parallel to the first direction x and a plurality of columns substantially parallel to the second direction y. In an example embodiment, a single column of circuit portions 100*a* may be arranged between two adjacent cutting regions 150. The cutting regions 150 may extend substantially perpendicular to the main applying direction 200 of a stress (e.g., a compressive stress) applied to the package substrate. The extension length t1 of the cutting regions 150 may be longer than the length t2 of the circuit portion 100*a* in the second direction y.

Referring to FIG. 8D, the cutting regions 150 may discontinuously extend in the second direction y and may be spaced apart from each other in the first direction x. The circuit portions 100*a* may be arranged to form a plurality of rows substantially parallel to the first direction x and a plurality of columns substantially parallel to the second direction y. In an example embodiment, at least two columns of circuit portions 100*a* may be arranged between two adjacent first cutting regions 150. The cutting regions 150 may extend substantially perpendicularly to the main applying direction 200 of a stress (e.g., a compressive stress) applied to the package substrate. The extension length t1 of the cutting regions 150 may be longer than the length t2 of the circuit portion 100*a* in the second direction y.

Figure 8E:
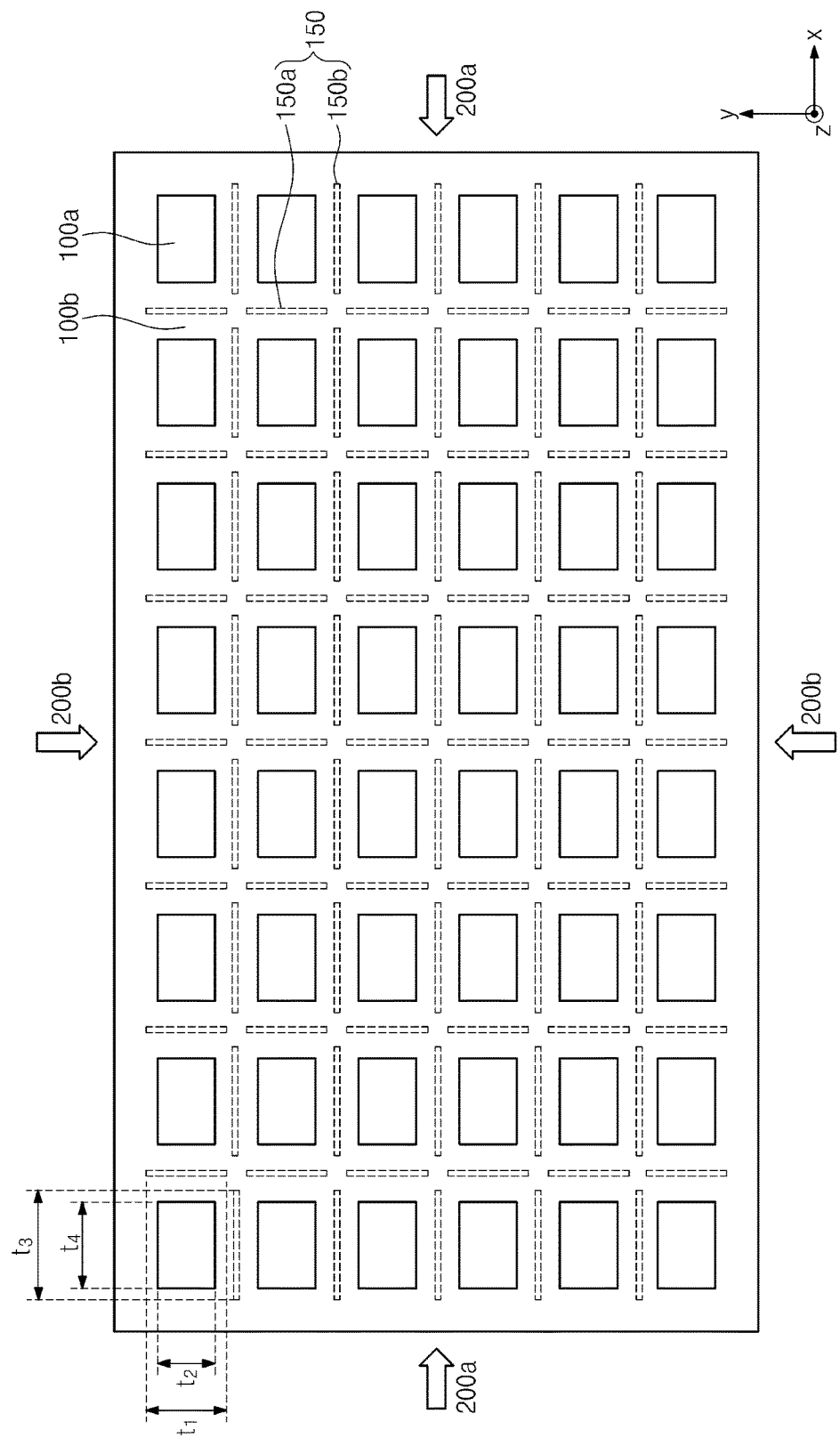

Referring to FIG. 8E, the cutting regions 150 may include the first cutting region 150*a* discontinuously extending in the second direction y and the second cutting region 150*b* discontinuously extending in the first direction x. The circuit portions 100*a* may be arranged to form a plurality of rows substantially parallel to the first direction x and a plurality of columns substantially parallel to the second direction y. The first cutting regions 150*a* may extend substantially perpendicular to the main first applying direction 200*a* of a stress (e.g., a compressive stress) applied to the package substrate, and the second cutting regions 150*b* may extend substantially perpendicular to the main second applying direction 200*b* of a stress (e.g., a compressive stress) applied to the package substrate. The extension length t1 of the first cutting regions 150*a* may be longer than the length t2 of the circuit portion 100*a* in the second direction y, and the extension length t3 of the second cutting regions 150*b* may be longer than the length t4 of the circuit portion 100*a* in the first direction x.

In some other embodiments, multiple cutting regions 150 may be formed between two adjacent circuit portions 100*a*. For example, FIG. 8F illustrate two cutting regions 150 formed between two adjacent circuit portions 100*a*, whereas the above-described embodiments illustrate a single cutting region 150 between two adjacent circuit portions 100*a*.

The cutting regions 150 of FIGS. 8A through 8F may be filled with an insulating material, as previously described with reference to FIGS. 1 through 5D, and may expose the core portion 110 as shown in FIGS. 6A, 6B, 7A, and 7B. Furthermore, a space between the cutting regions 150 may not be limited to the above-described examples.

Figure 9:
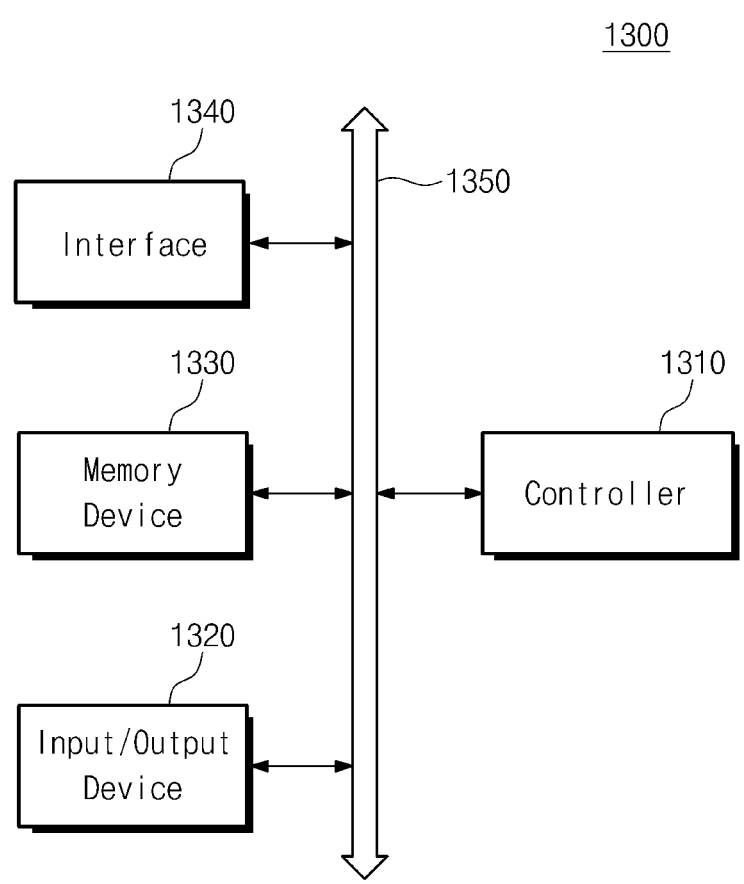
FIG. 9 is a schematic block diagram illustrating an example of an electronic device including a semiconductor package according to an embodiment of the inventive concept.

FIG. 9 is a block diagram schematically illustrating an electronic system including a semiconductor package according to an embodiment of the inventive concept.

The semiconductor package according to an embodiment of the inventive concept may be applied to an electronic system. For example, the semiconductor package according to an embodiment of the inventive concept may be provided in the form of a memory device. Referring to FIG. 9, an electronic system 1300 may include a controller 1310, an input/output (I/O) unit 1320, and a memory device 1330. The controller 1310, the I/O unit 1320, and the memory device 1330 may be combined with each other through a data bus 1350. The data bus 1350 may correspond to a path through which electrical signals are transmitted. The controller 1310 may include at least one of a microprocessor, a digital signal processor, a microcontroller, or another similar logic device. The controller 1310 and the memory device 1330 may include one of the semiconductor packages according to an embodiment of the inventive concept. The I/O unit 1320 may include at least one of a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may be configured to operate in a wireless or wired manner For example, the interface unit 1340 may include an antenna for wireless communication or a transceiver for wired communication. Although not shown in the drawings, the electronic system 1300 may further include an application chipset, a camera image processor (CIS), and an input-output unit.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 10:
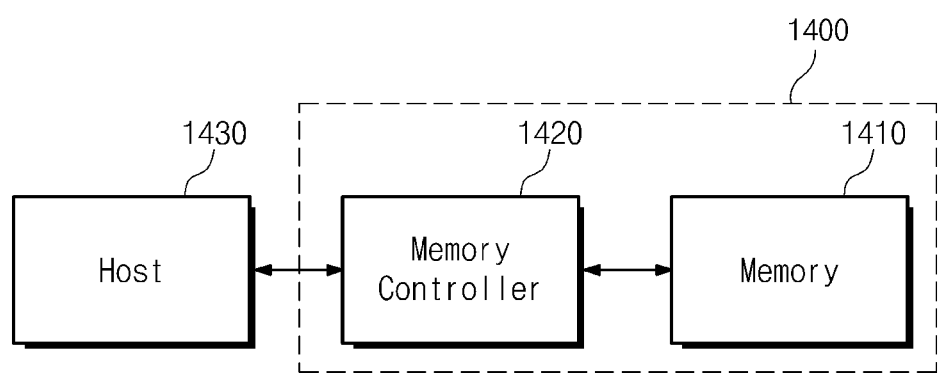
FIG. 10 is a schematic block diagram illustrating an example of a memory system including a semiconductor package according to an embodiment of the inventive concept.

FIG. 10 is a block diagram illustrating an example of memory systems including a semiconductor package according to an embodiment of the inventive concept.

The semiconductor package may be provided in the form of a memory card. Referring to FIG. 10, a memory system 1400 may include a non-volatile memory device 1410 (e.g., a FLASH memory device) and a memory controller 1420. The non-volatile memory device 1410 and the memory controller 1420 may be configured to store data or read stored data. The non-volatile memory device 1410 may include at least one of the semiconductor packages according to an embodiment of the inventive concept. The memory controller 1420 may control the non-volatile memory device 1410 to read the stored data and/or to store data in response to read/write request of a host 1430.

According to an embodiment of the inventive concept, cutting regions may be provided in a package substrate.

Accordingly, it is possible to prevent a stress from being transferred through the package substrate and thereby to prevent shrinkage and warpage of the package substrate.

According to an embodiment of the inventive concept, a package substrate may be cut or divided into a plurality of semiconductor chips, after a build-up of the package substrate, and thus, it is possible to prevent shrinkage and warpage of the package substrate and prevent the package substrate from being broken and being erroneously delivered in a process of fabricating a package device.

While example embodiments of the inventive concepts have been particularly shown and described, it will be understood by one of ordinary skill in the art that variations in form and detail may be made therein without departing from the spirit and scope of the attached claims.

What is claimed is:

1. A package substrate, comprising:
   a core portion comprising a first surface and a second surface arranged opposite to each other;
   cutting regions provided to expose at least a portion of an inside of the core portion, wherein the inside of the core portion is an inner sidewall connected to the first surface;
   an insulating layer provided to cover the first and second surfaces of the core portion and fill completely the cutting regions; and
   circuit patterns disposed on the insulating layer,
   wherein the cutting regions are spaced apart from each other in a first direction parallel to an extension direction of the core portion,
   wherein the cutting regions are provided on the first surface of the core portion to extend in a second direction perpendicular to the first direction, and
   wherein the insulating layer is in contact with inner sidewalls of the cutting regions.

2. The package substrate of claim 1, wherein the cutting regions comprise:
   first cutting regions completely penetrating the core portion in a thickness direction oriented from the first surface of the core portion toward the second surface so that the inner sidewall of the core portion is further connected to the second surface and having a slit-type structure.

3. The package substrate of claim 2,
   wherein the cutting regions further comprise:
   second cutting regions, which are provided on the first surface of the core portion to extend in the first direction, crossing the first cutting regions, completely penetrating the core portion in the thickness direction of the core portion, and having a slit-type structure, and the second cutting regions are spaced apart from each other in the second direction.

4. The package substrate of claim 1, wherein the cutting regions comprise: first cutting regions partially penetrating the core portion in a thickness direction oriented from the first surface of the core portion toward the second surface, being open toward the first surface of the core portion, being spaced apart from the second surface of the core portion, and having a trench-type structure.

5. The package substrate of claim 4, wherein the cutting regions further comprise:
   second cutting regions, which are provided on the first surface of the core portion to extend in the first direction, crossing the first cutting regions, partially penetrating the core portion in the thickness direction of the core portion, being open toward the first surface of the core portion, being spaced apart from the second surface of the core portion, and having a trench-type structure, and the second cutting regions are spaced apart from each other in the second direction.

6. The package substrate of claim 1, wherein the core portion comprises circuit portions and a connecting portion between the circuit portions, and the cutting regions comprise first cutting regions, which are provided on the first surface to cut a portion of the core portion corresponding to the connecting portion along the first direction.

7. The package substrate of claim 6, wherein the cutting regions further comprise second cutting regions, which are provided on the first surface to cross the first cutting regions and to cut a portion of the core portion corresponding to the connecting portion along a second direction crossing the first direction.

8. A package substrate, comprising a substrate with top and bottom surfaces arranged opposite to each other,
   wherein the substrate comprises:
   circuit portions arranged in a matrix shape on the top surface;
   a connecting portion separating the circuit portions from each other;
   first cutting regions provided on the connecting portion to extend in a first direction crossing the top surface and spaced apart from each other in a second direction perpendicular to the first direction; and
   an insulating layer filling completely the first cutting regions,
   wherein the first cutting regions are provided to expose an inside of the substrate corresponding to the connecting portion between the circuit portions and to prevent a stress applied to the substrate from being transferred between the circuit portions, and
   wherein no conductive pattern is in contact with inner sidewalls of one of the first cutting regions, and
   wherein the inner sidewalls are connected to the top surface.

9. The package substrate of claim 8,
   wherein the first cutting regions are spaced apart from each other, by a specific space, in the second direction.

10. The package substrate of claim 8,
    wherein the substrate further comprises second cutting regions, which are provided between the circuit portions to extend along the second direction crossing the first direction and are spaced apart from each other in the first direction to cross the first cutting regions.

11. The package substrate of claim 1,
    wherein no conductive pattern is in contact with inner sidewalls of one of the cutting regions.

12. The package substrate of claim 8,
    wherein the insulating layer is provided to cover the circuit portions, and
    wherein the insulating layer is extended into the one of the first cutting regions.

13. The package substrate of claim 12,
    wherein the insulating layer is in contact with inner sidewalls of the one of the first cutting regions.

* * * * *